US012615935B2

(12) United States Patent
Tsuboi

(10) Patent No.: US 12,615,935 B2
(45) Date of Patent: Apr. 28, 2026

(54) LIGHT EMITTING APPARATUS, DISPLAY APPARATUS, PHOTOELECTRIC CONVERSION APPARATUS, ELECTRONIC DEVICE, ILLUMINATION APPARATUS, AND MOVING BODY

(71) Applicant: CANON KABUSHIKI KAISHA, Tokyo (JP)

(72) Inventor: Hiromasa Tsuboi, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 410 days.

(21) Appl. No.: 18/483,024

(22) Filed: Oct. 9, 2023

(65) Prior Publication Data

US 2024/0172506 A1     May 23, 2024

(30)     Foreign Application Priority Data

Nov. 18, 2022     (JP) ................................. 2022-184972
Jun. 30, 2023     (JP) ................................. 2023-108524

(51) Int. Cl.
     *H10K 59/131*          (2023.01)
     *H10K 59/121*          (2023.01)
               (Continued)
(52) U.S. Cl.
     CPC ....... *H10K 59/131* (2023.02); *H10K 59/1213* (2023.02); *H10K 59/1216* (2023.02);
               (Continued)
(58) Field of Classification Search
     CPC ............. H10K 59/131; H10K 59/1213; H10K 59/1216; H10K 59/123; F21S 41/141;
               (Continued)

(56)               References Cited

U.S. PATENT DOCUMENTS 10,818,232 B2    10/2020  Tsuboi
10,867,561 B2    12/2020  Ota
                   (Continued)

FOREIGN PATENT DOCUMENTS

JP        2013-092791 A      5/2013
JP        2014-142560 A      8/2014
                   (Continued)

OTHER PUBLICATIONS

JP 2020-076841 A, U.S. Pat. No. 10,818,232 B2 U.S. Pat. No. 11,282,453 B2 US 2020/0143740 A1 US 2021/0005142 A1.
                   (Continued)

*Primary Examiner* — Ermias T Woldegeorgis
(74) *Attorney, Agent, or Firm* — Venable LLP

(57)               ABSTRACT

A light emitting apparatus includes a light emitting element, a first transistor for controlling luminance of the light emitting element, a first capacitive element including a first electrode and a second electrode, and a second capacitive element including a third electrode and a fourth electrode. The first electrode is electrically connected to a control terminal of the first transistor. Each of the second and third electrodes is electrically connected to the main terminal of the first transistor. The fourth electrode is electrically connected to a power supply line. The second electrode includes a first portion facing the first electrode on a surface on side of the first electrode. A shortest distance from a second portion of the third electrode to the first electrode is shorter than a shortest distance from the second portion to the first portion of the second electrode.

15 Claims, 12 Drawing Sheets

(51) Int. Cl.

| | |
|---|---|
| *H10K 59/123* | (2023.01) |
| *F21S 41/141* | (2018.01) |
| *F21V 23/00* | (2015.01) |
| *F21Y 115/15* | (2016.01) |
| *G06F 1/16* | (2006.01) |
| *H04N 23/63* | (2023.01) |

(52) U.S. Cl.
CPC .......... *H10K 59/123* (2023.02); *F21S 41/141* (2018.01); *F21V 23/004* (2013.01); *F21Y 2115/15* (2016.08); *G06F 1/1626* (2013.01); *H04N 23/63* (2023.01)

(58) Field of Classification Search
CPC . F21S 43/145; F21S 43/26241; F21V 23/004; F21Y 2115/15; G06F 1/1626; H04N 23/63; G09G 3/3233
See application file for complete search history.

(56) References Cited

U.S. PATENT DOCUMENTS

| | | | |
|---|---|---|---|
| 10,998,392 | B2 | 5/2021 | Tsuboi |
| 11,087,680 | B2 | 8/2021 | Tsuboi |
| 11,282,453 | B2 | 3/2022 | Tsuboi |
| 11,393,430 | B2 | 7/2022 | Nagasaki |
| 11,495,656 | B2 | 11/2022 | Akiyama |
| 11,527,591 | B2 | 12/2022 | Tsuboi |
| 11,778,862 | B2 | 10/2023 | Miura |
| 11,823,643 | B2 | 11/2023 | Tsuboi |
| 11,842,682 | B2 | 12/2023 | Komazawa |
| 2019/0189725 | A1 | 6/2019 | Miura |
| 2020/0126481 | A1 | 4/2020 | Tsuboi |
| 2020/0143740 | A1* | 5/2020 | Tsuboi ................. G09G 3/3233 |
| 2021/0005142 | A1 | 1/2021 | Tsuboi |
| 2021/0111227 | A1* | 4/2021 | Tsuboi .............. H10K 59/1213 |
| 2021/0384280 | A1* | 12/2021 | Akiyama ............. G06F 1/1626 |
| 2023/0043411 | A1 | 2/2023 | Igarashi |
| 2023/0061540 | A1 | 3/2023 | Nagasaki |
| 2023/0071385 | A1 | 3/2023 | Tsuboi |
| 2023/0343292 | A1 | 10/2023 | Komazawa |

FOREIGN PATENT DOCUMENTS

| | | |
|---|---|---|
| JP | 2020-076841 A | 5/2020 |
| WO | 2018/047492 A | 3/2018 |

OTHER PUBLICATIONS

WO 2018/047492 A, U.S. Pat. No. 11,778,862 B2 US 2019/0189725 A1.

* cited by examiner

F I G. 1
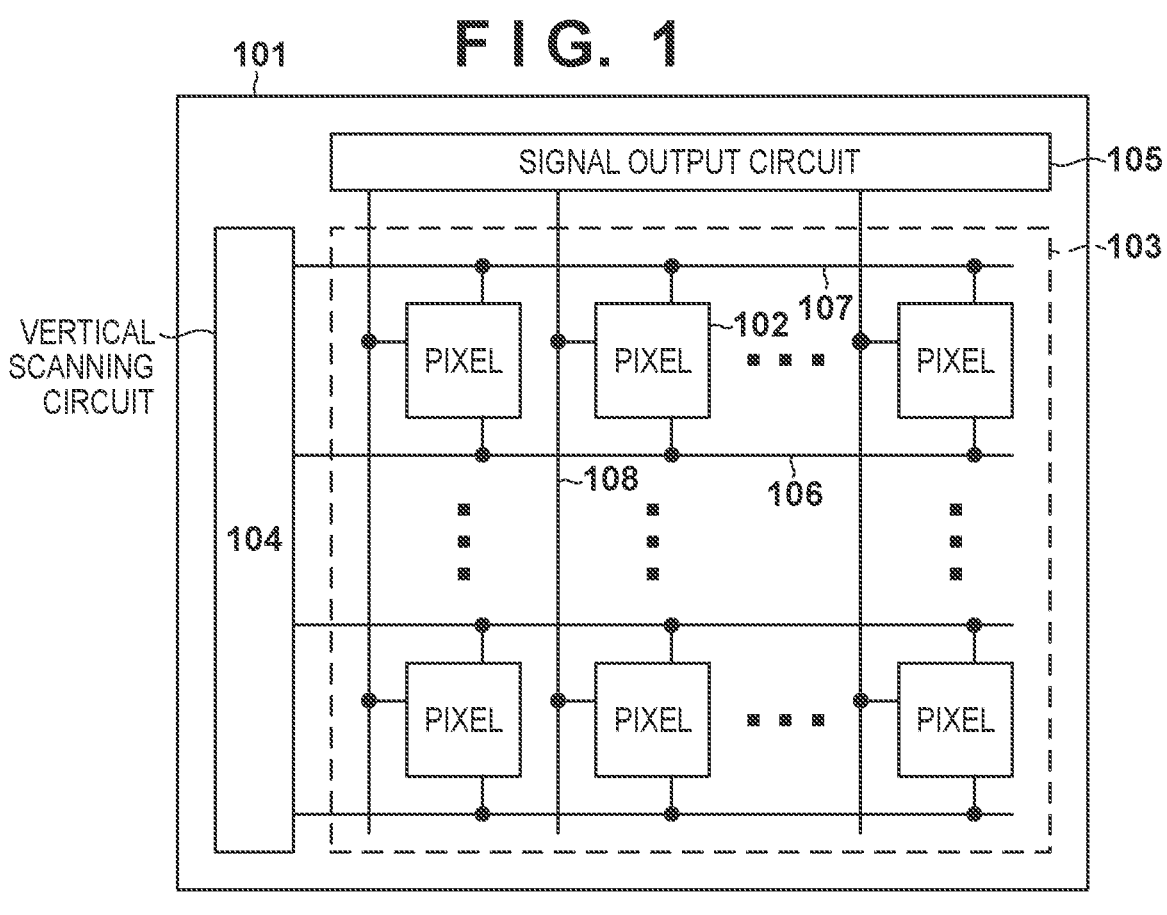
F I G. 2

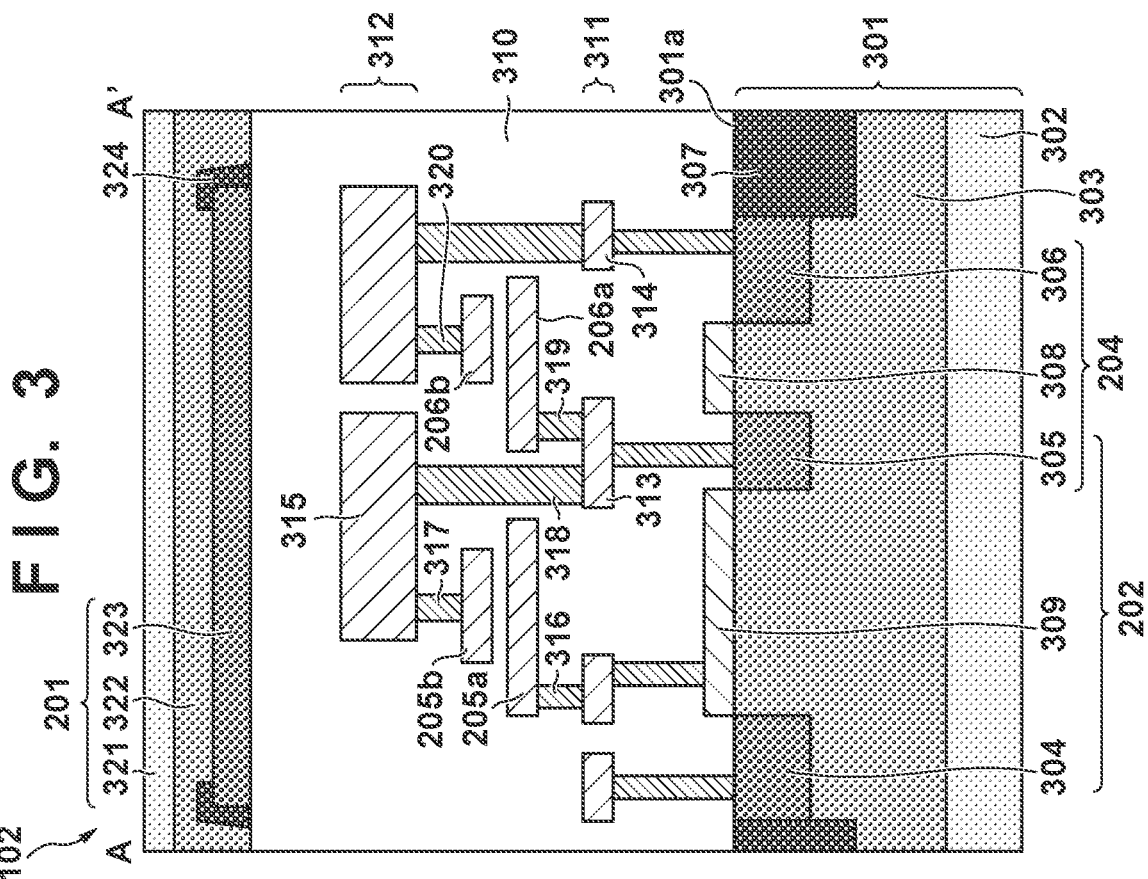
F I G. 4
F I G. 3

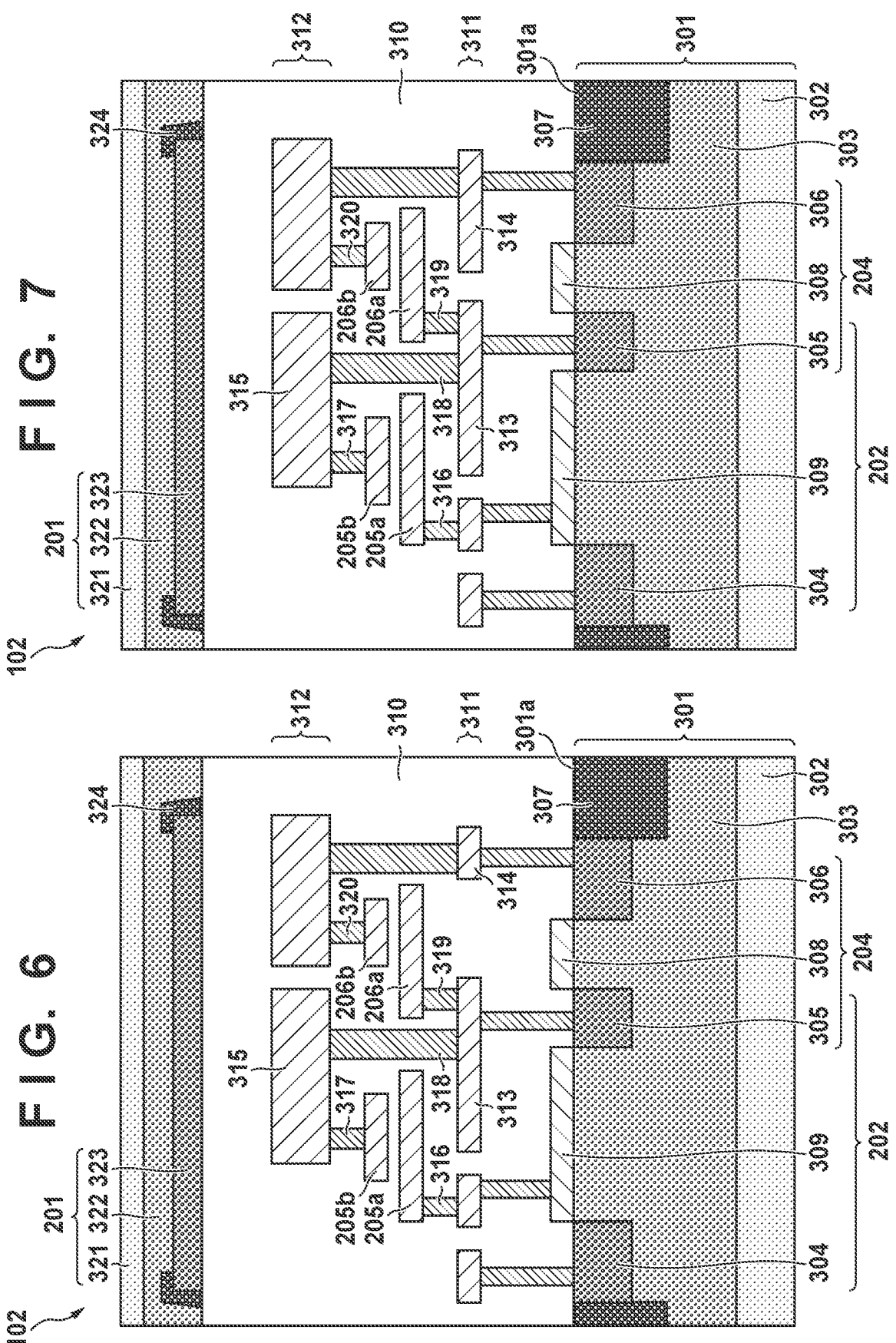

F I G. 8
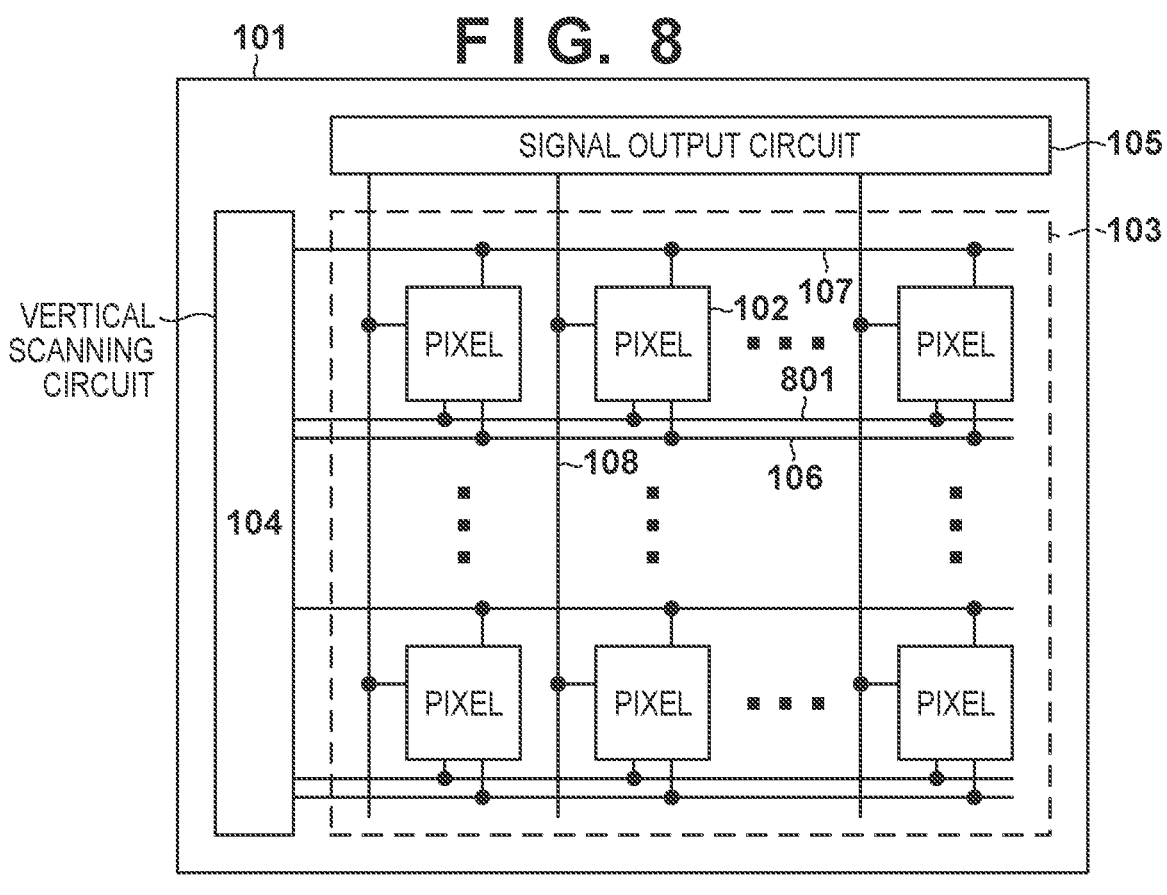
F I G. 9

F I G.  10
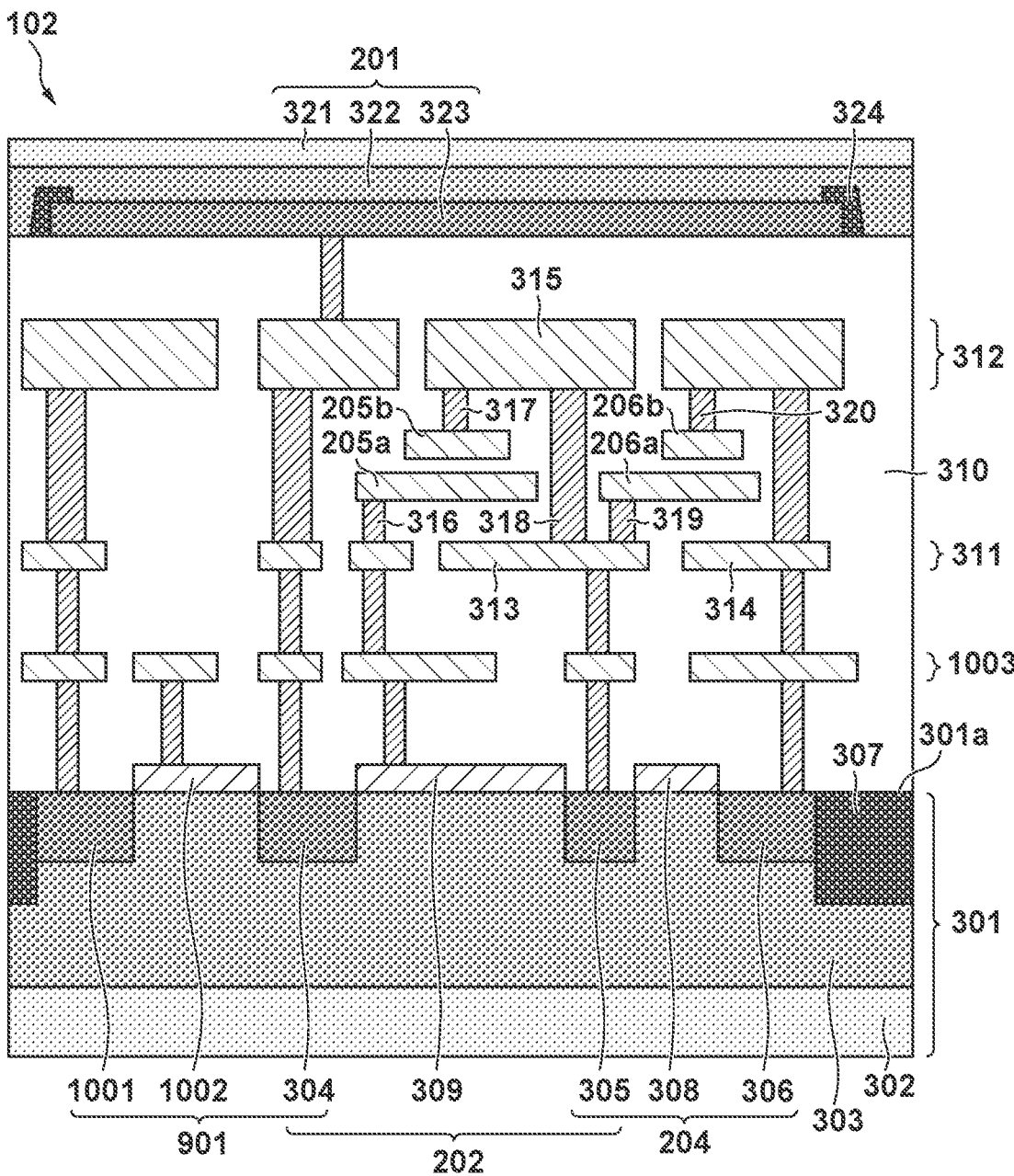

F I G. 11A
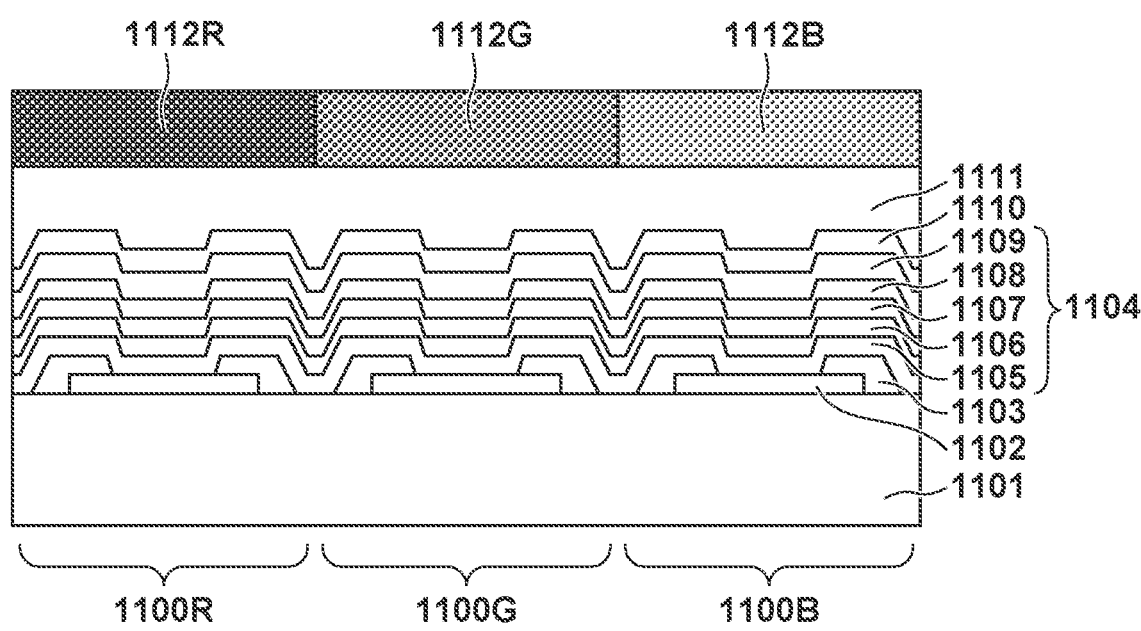
F I G. 11B
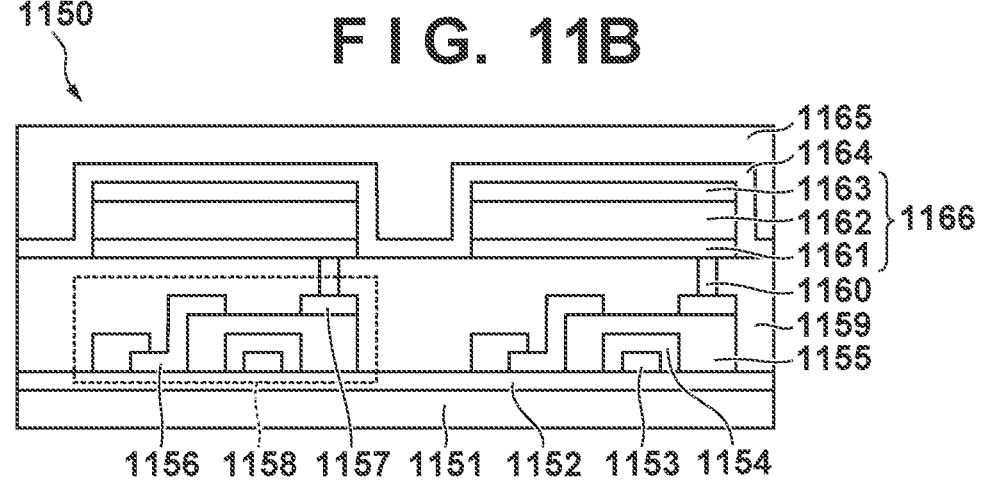

F I G.  12
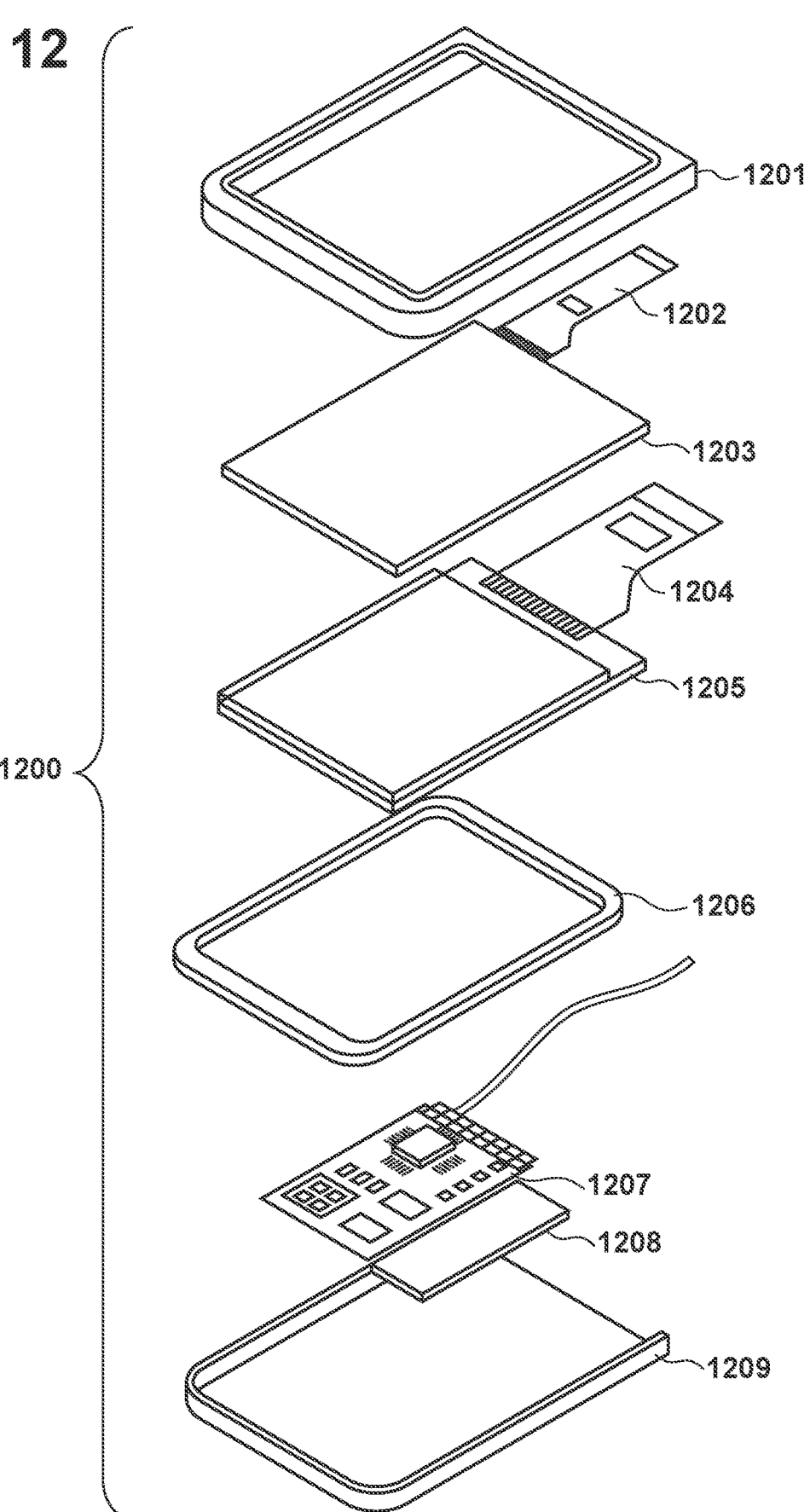
1201
1202
1203
1204
1205
1206
1207
1208
1209
1200

F I G. 13A
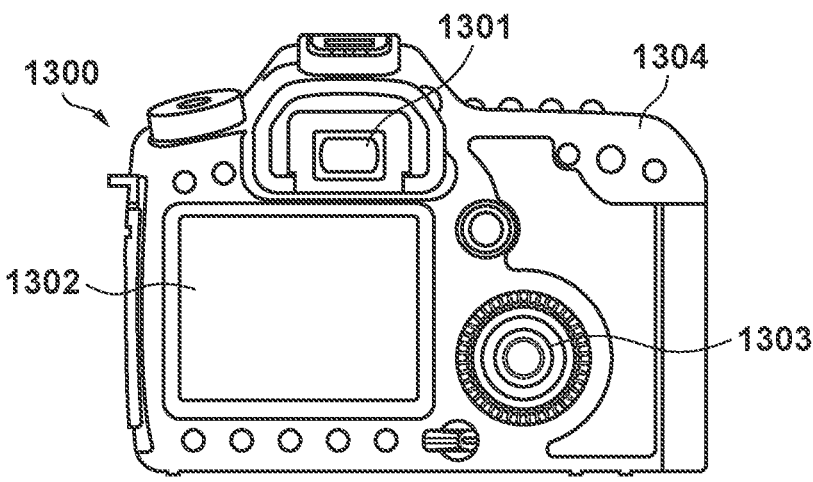
F I G. 13B
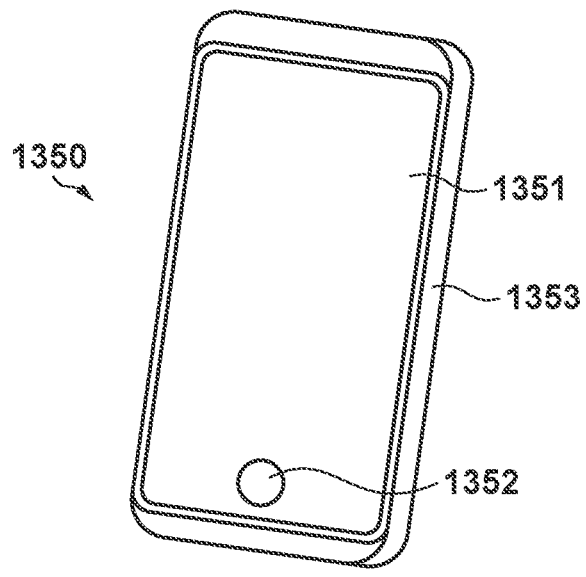

F I G. 14A
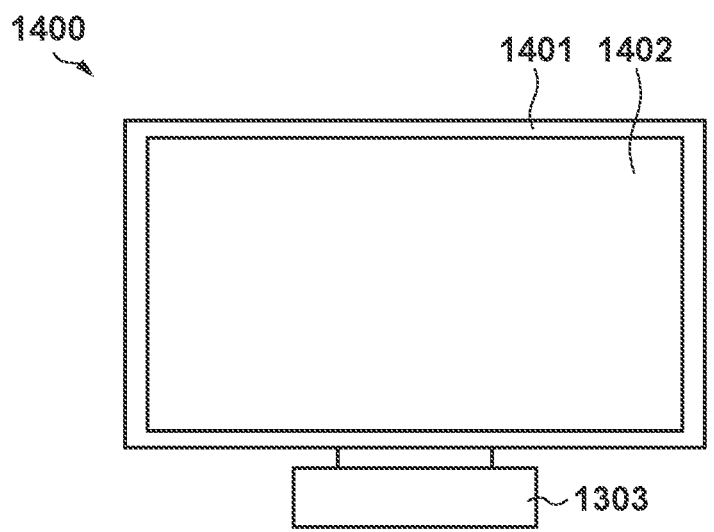
F I G. 14B
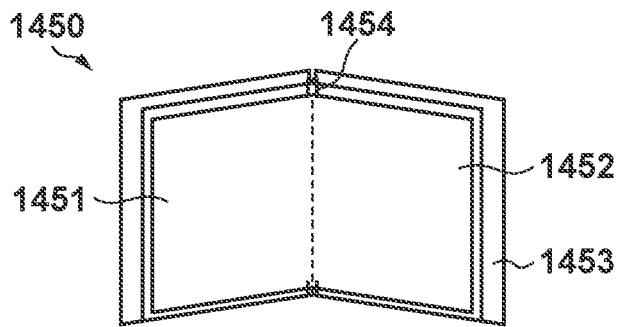

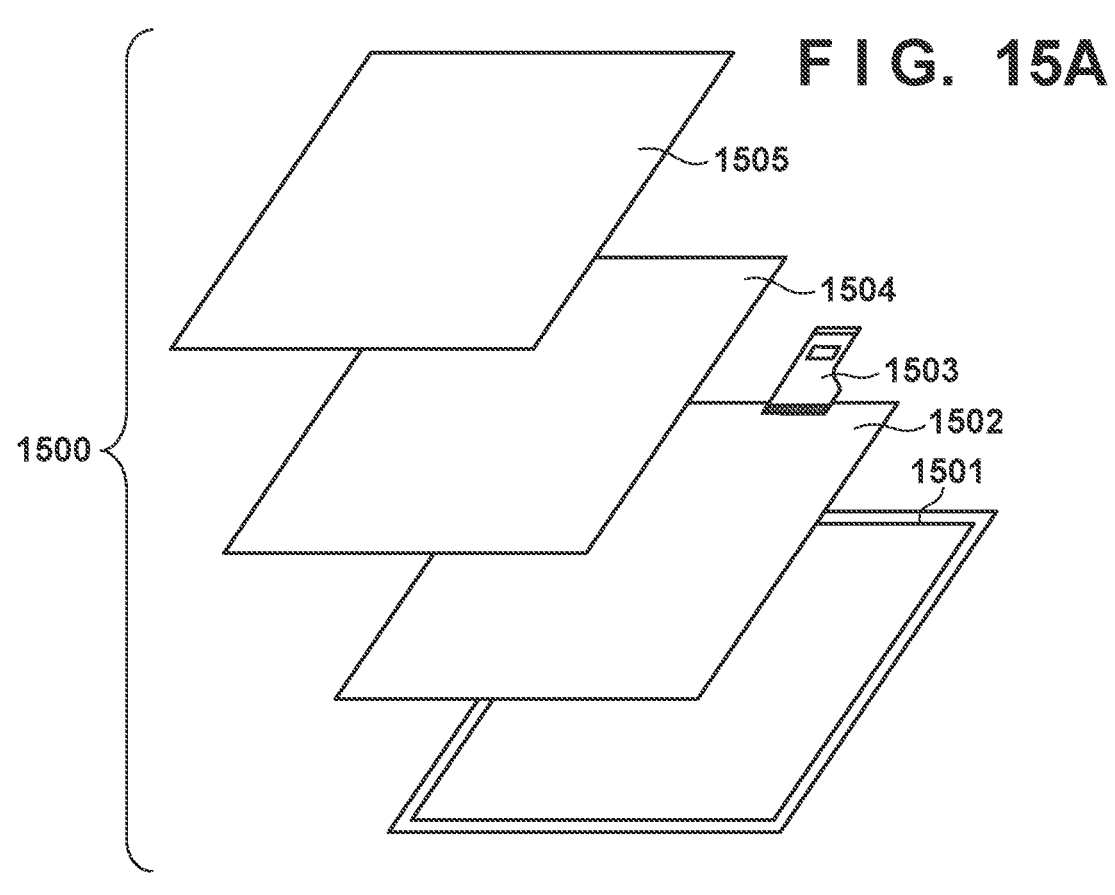
F I G. 15A
1505
1504
1503
1502
1501
1500
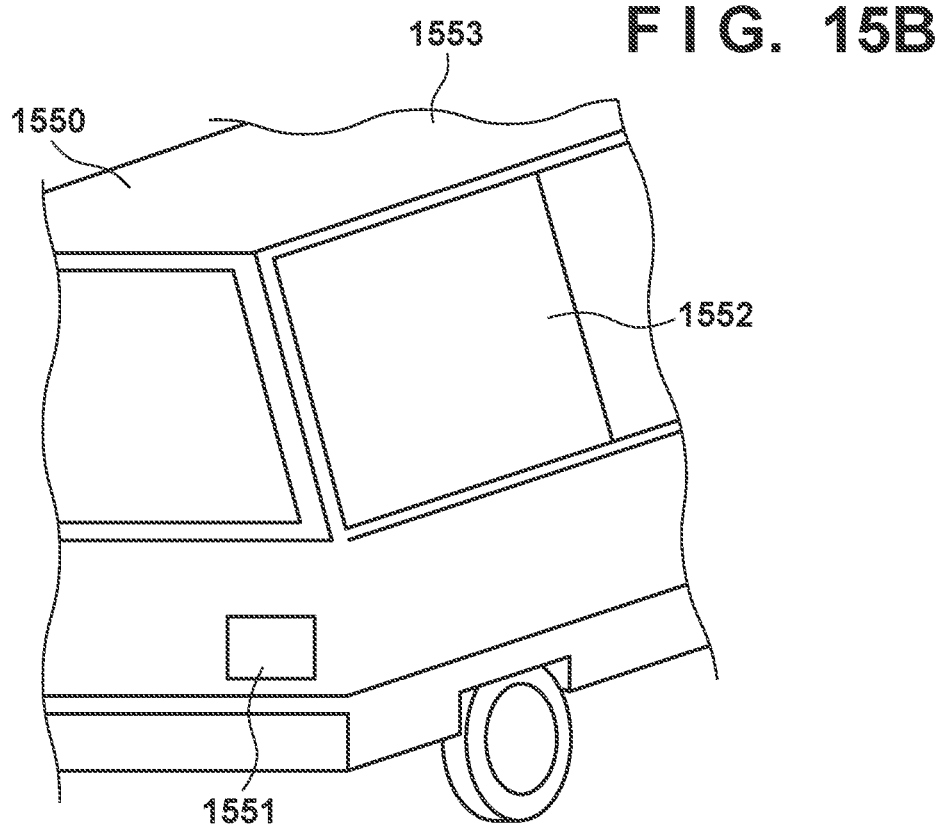
F I G. 15B
1553
1550
1552
1551

LIGHT EMITTING APPARATUS, DISPLAY APPARATUS, PHOTOELECTRIC CONVERSION APPARATUS, ELECTRONIC DEVICE, ILLUMINATION APPARATUS, AND MOVING BODY

BACKGROUND OF THE INVENTION

Field of the Invention

The present invention relates to a light emitting apparatus, a display apparatus, a photoelectric conversion apparatus, an electronic device, an illumination apparatus, and a moving body.

Description of the Related Art

A light emitting apparatus described in Japanese Patent Laid-Open No. 2020-76841 includes a drive transistor for controlling the amount of current supplied to a light emitting element and a light emission control transistor for controlling light emission and non-light emission by the light emitting element. A luminance signal is supplied to the gate electrode of the drive transistor. The light emitting apparatus further includes a capacitive element for holding the luminance signal and another capacitive element connected to the capacitive element. When the leakage current flows into the capacitive element holding the luminance signal, the value of the luminance signal changes. The change in the luminance signal due to the leakage current decreases as the capacitance value of the capacitive element holding the luminance signal increases.

SUMMARY OF THE INVENTION

An aspect of the present disclosure provides a technique for increasing a capacitance value of a capacitive element for holding a luminance signal.

According to some embodiments, a light emitting apparatus includes: a light emitting element; a first transistor including a main terminal and a control terminal configured to receive a first signal for controlling luminance of the light emitting element, the first transistor being configured to supply a current corresponding to a voltage between the main terminal and the control terminal to the light emitting element; a first capacitive element including a first electrode and a second electrode; and a second capacitive element including a third electrode and a fourth electrode. The first electrode is electrically connected to the control terminal of the first transistor. Each of the second electrode and the third electrode is electrically connected to the main terminal of the first transistor. The fourth electrode is electrically connected to a power supply line. The second electrode includes a first portion facing the first electrode on a surface on side of the first electrode. The third electrode includes a second portion. A shortest distance from the second portion to the first electrode is shorter than a shortest distance from the second portion to the first portion of the second electrode.

Further features of the present invention will become apparent from the following description of exemplary embodiments with reference to the attached drawings.

BRIEF DESCRIPTION OF THE DRAWINGS

FIG. 1 is a block diagram illustrating an example of an overall configuration of a light emitting apparatus according to a first embodiment.

FIG. 2 is an equivalent circuit diagram illustrating an example of a configuration of a pixel of the light emitting apparatus according to the first embodiment.

FIG. 3 is a schematic cross-sectional view illustrating an example of a configuration of the pixel of the light emitting apparatus according to the first embodiment.

FIG. 4 is a schematic plan view illustrating an example of a configuration of the pixel of the light emitting apparatus according to the first embodiment.

FIG. 6 is a schematic cross-sectional view illustrating an example of a configuration of a pixel of a light emitting apparatus according to a second embodiment.

FIG. 7 is a schematic cross-sectional view illustrating an example of a configuration of a pixel of a light emitting apparatus according to a third embodiment.

FIG. 8 is a block diagram illustrating an example of an overall configuration of a light emitting apparatus according to a fourth embodiment.

FIG. 9 is an equivalent circuit diagram illustrating an example of a configuration of a pixel of the light emitting apparatus according to the fourth embodiment.

FIG. 10 is a schematic cross-sectional view illustrating an example of a configuration of the pixel of the light emitting apparatus according to the fourth embodiment.

FIG. 11A and FIG. 11B are diagrams illustrating an example of a display apparatus using the light emitting apparatus according to the embodiment described above.

FIG. 12 is a diagram illustrating an example of a display apparatus using the light emitting apparatus according to the embodiment described above.

FIG. 13A and FIG. 13B illustrate an example of a photoelectric conversion apparatus and an electronic device using the light emitting apparatus according to the embodiment described above.

FIG. 14A and FIG. 14B are diagrams illustrating an example of a display apparatus using the light emitting apparatus according to the embodiment described above.

FIG. 15A and FIG. 15B are diagrams illustrating an example of an illumination apparatus and a moving body using the light emitting apparatus according to the embodiment described above.

DESCRIPTION OF THE EMBODIMENTS

Figures 5A, 5B, 5C:
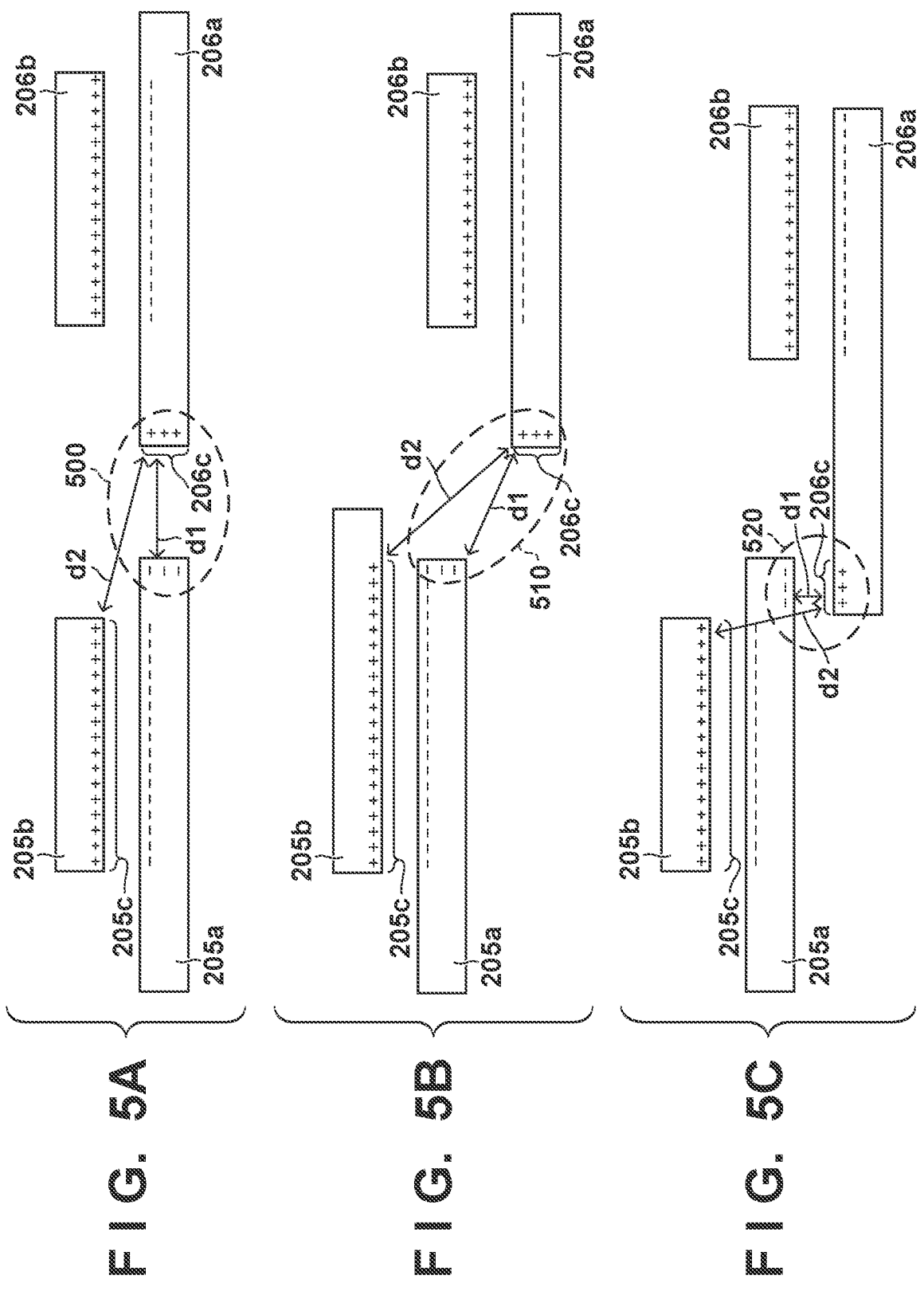
FIG. 5A to FIG. 5C are schematic cross-sectional views illustrating an example of electrode arrangement of the pixel of the light emitting apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

An example of an overall configuration of a light emitting apparatus 101 according to a first embodiment will be described with reference to FIG. 1. The light emitting apparatus 101 includes a pixel array unit 103 and a driving unit disposed around the pixel array unit 103. The pixel array unit 103 includes a plurality of pixels 102 arranged in an array form. Each of the pixels 102 includes a light emitting element 201 (described below with reference to FIG. 2). The light emitting element 201 includes an anode and a cathode. The light emitting element 201 has an organic layer between the anode and the cathode. The organic layer includes a light emitting layer. The organic layer may include one or more of a hole injection layer, a hole transport layer, an electron injection layer, and an electron transport layer in addition to the light emitting layer.

The driving unit is a circuit for driving the pixels 102 arranged in the pixel array unit 103. The driving unit includes, for example, a vertical scanning circuit 104 and a signal output circuit 105. In order to supply signals from the driving unit to the pixels 102, a plurality of scanning lines 106, a plurality of scanning lines 107, and a plurality of signal lines 108 are arranged in the pixel array unit 103. Each of the plurality of scanning lines 106 extends in a row direction (horizontal direction in FIG. 1). The plurality of scanning lines 106 may correspond one-to-one to a plurality of pixel rows of the pixel array unit 103. Each of the plurality of scanning lines 107 extends in the row direction. The plurality of scanning lines 107 may correspond one-to-one to a plurality of pixel rows of the pixel array unit 103. Each of the plurality of signal lines 108 extends in a column direction (vertical direction in FIG. 1). The plurality of signal lines 108 may correspond one-to-one to a plurality of pixel columns of the pixel array unit 103.

The vertical scanning circuit 104 has an output terminal connected to the scanning line 106 and an output terminal connected to the scanning line 107 for each pixel row. The signal output circuit 105 has an output terminal connected to the signal line 108 for each pixel column.

In order to write a luminance signal to each of the pixels 102 of the pixel array unit 103, the vertical scanning circuit 104 supplies a write control signal to the pixel 102 through the scanning line 106. The luminance signal is a signal for controlling the luminance of the light emitting element 201. When the light emitting apparatus 101 is used in a display apparatus, the luminance signal may be referred to as an image signal. The write control signal is a signal for controlling writing of the luminance signal to the pixel 102. The vertical scanning circuit 104 supplies a light emission control signal to the pixel 102 through the scanning line 107. The light emission control signal is a signal for controlling light emission or non-light emission of the pixel 102 (specifically, the light emitting element 201 thereof). The signal output circuit 105 selects one of the above-described luminance signal and a reference voltage signal having a reference voltage, and supplies the selected signal to the pixel 102 through the signal line 108.

An example of a circuit configuration of the pixel 102 will be described with reference to FIG. 2. Each of the plurality of pixels 102 includes the light emitting element 201, a drive transistor 202, a write control transistor 203, a light emission control transistor 204, a capacitive element 205, and a capacitive element 206. In the following description, it is assumed that the drive transistor 202 is connected to the anode of the light emitting element 201 and all transistors included in the pixel 102 are P-type transistors. However, the configuration of the pixel 102 is not limited thereto. For example, the polarity of the light emitting element 201 and the conductivity types of all the transistors of the pixel 102 may be opposite to those in the example illustrated in FIG. 2. Further, the drive transistor 202 may be a P-type transistor and the other transistors may be N-type transistors. A supplied potential or connection is changed in accordance with the conductivity type or polarity of the light emitting element 201 or the transistor. Further, the number of transistors and capacitive elements included in the pixel 102 is not limited to the example in FIG. 2.

In the following description, each transistor has a control terminal and two main terminals. The control terminal may be a gate and the two main terminals may be a source and a drain. An expression "a transistor is connected between an element A and an element B" means that one of the main terminals of the transistor is electrically connected to the element A and the other one of the main terminals of the transistor is electrically connected to the element B. In the description of the circuit diagram in FIG. 2, "electrically connected" is simply referred to as "connected".

The light emitting element 201 emits light at a luminance corresponding to the supplied current. An organic electroluminescent (EL) element may be used as the light emitting element 201. The capacitance between the anode and the cathode of the light emitting element 201 is charged to a predetermined potential by the current supplied to the light emitting element 201, and a current corresponding to the potential difference flows through the light emitting element 201. As a result, the light emitting element 201 emits light with the designated luminance.

The drive transistor 202 supplies a current corresponding to the luminance signal to the light emitting element 201. Specifically, the control terminal of the drive transistor 202 receives the luminance signal. The drive transistor 202 supplies a current corresponding to a voltage between one main terminal (for example, the source) and the control terminal, to the light emitting element 201.

The light emission control transistor 204 controls light emission or non-light emission of the light emitting element 201 based on the light emission control signal. Specifically, the control terminal of the light emission control transistor 204 receives the light emission control signal. The light emission control transistor 204 is in a conductive state or a non-conductive state in accordance with the value of the light emission control signal.

In the configuration illustrated in FIG. 2, the light emitting element 201, the drive transistor 202, and the light emission control transistor 204 are arranged on a current path connecting a power supply line 207 and a power supply line 208. The power supply line 207 supplies a power supply voltage Vdd. The power supply line 208 supplies a power supply voltage Vss. The power supply voltage Vdd is higher than the power supply voltage Vss.

In the example illustrated in FIG. 2, the cathode of the light emitting element 201 is connected to the power supply line 208. The anode of the light emitting element 201 is connected to one main terminal (for example, the drain) of the drive transistor 202. The other main terminal (for example, the source) of the drive transistor 202 is connected to one main terminal (for example, the drain) of the light emission control transistor 204. The other main terminal (for example, the source) of the light emission control transistor 204 is connected to the power supply line 207. The control terminal of the light emission control transistor 204 is connected to the scanning line 107.

The configuration of FIG. 2 may be modified with another element arranged on a path between the power supply line 208 and the light emitting element 201 or between the power supply line 207 and the light emission control transistor 204. Further, another element may be arranged on a path between the light emitting element 201 and the drive transistor 202 or between the drive transistor 202 and the light emission control transistor 204. Further, the light emission control transistor 204 may be arranged on a path between the light emitting element 201 and the drive transistor 202 instead of between the drive transistor 202 and the power supply line 207.

The write control transistor 203 controls the supply of the luminance signal to the control terminal of the drive transistor 202. Specifically, the control terminal of the write control transistor 203 receives the write control signal. The write control transistor 203 is in a conductive state or non-conductive state in accordance with the value of the write control signal. While the write control transistor 203 is in the conductive state, the luminance signal or the reference voltage signal from the signal line 108 is supplied to the control terminal of the drive transistor 202. While the write control transistor 203 is in the non-conductive state, no signal from the signal line 108 is supplied to the control terminal of the drive transistor 202.

The write control transistor 203 is connected on a path between the signal line 108 and the control terminal of the drive transistor 202. Specifically, one main terminal of the write control transistor 203 is connected to the control terminal of the drive transistor 202. The other main terminal of the write control transistor 203 is connected to the signal line 108. The control terminal of the write control transistor 203 is connected to the scanning line 106.

The capacitive element 205 includes an electrode 205a and an electrode 205b. The capacitive element 206 includes an electrode 206a and an electrode 206b. The electrode 205a is connected to a node 209 on a path between the control terminal of the drive transistor 202 and the main terminal of the write control transistor 203. In the example illustrated in FIG. 2, the electrode 205a is connected to the control terminal of the drive transistor 202 and the main terminal of the write control transistor 203. Each of the electrode 205b and the electrode 206a is connected to a node 210 on a path between the main terminal of the drive transistor 202 and the main terminal of the light emission control transistor 204. In the example illustrated in FIG. 2, the electrode 205b and the electrode 206a are respectively connected to the main terminal of the drive transistor 202 and the main terminal of the light emission control transistor 204. The electrode 206b is connected to a node 211 on a path between the main terminal of the light emission control transistors 204 and the power supply line 207. In the example illustrated in FIG. 2, the electrode 206b is connected to each of the main terminal of the light emission control transistors 204 and the power supply line 207.

The drive transistor 202 causes the light emitting element 201 to emit light by supplying a current from the power supply line 207 to the light emitting element 201 via the light emission control transistor 204. More specifically, the drive transistor 202 supplies, to the light emitting element 201, a current corresponding to the voltage between the main terminal on the side opposite to the light emitting element 201 and the control terminal (that is, the voltage between the node 210 and the node 209). The capacitive element 205 holds the voltage of the node 209.

The write control transistor 203 transitions to the conductive state in response to the write control signal applied from the vertical scanning circuit 104 to the control terminal via the scanning line 106. As a result, the write control transistor 203 samples the signal voltage or the reference voltage of the luminance signal corresponding to luminance information supplied from the signal output circuit 105 via the signal line 108 and writes the signal voltage or the reference voltage to the pixel 102. The signal voltage or reference voltage thus written is applied to the control terminal of the drive transistor 202 and held in the capacitive element 205.

The light emission control transistor 204 transitions to the conductive state in response to the light emission control signal applied from the vertical scanning circuit 104 to the control terminal via the scanning line 107, thereby allowing a current to be supplied from the power supply line 207 to the drive transistor 202. Thus, as described above, the light emitting element 201 can be driven by the drive transistor 202.

Through a switching operation by the light emission control transistor 204, a period (non-light emission period) in which the light emitting element 201 is in the non-light emission state is provided, and the ratio between a light emission period in which the light emitting element 201 emits light and the non-light emission period can be controlled (what is known as duty control). With the duty control for controlling light emission/non-light emission of the light emitting element 201, it is possible to reduce an afterimage blur caused by light emission of the light emitting element 201 of each pixel 102 over one frame period, and in particular, whereby the image quality of a movie can be further improved in particular.

Due to a manufacturing error of the light emitting apparatus 101, a threshold voltage of the drive transistor 202 may differ among the pixels 102. Therefore, even if the same signal voltage is written to the pixels 102, the amount of current flowing through the drive transistor 202 varies, and the amount of light emission fluctuates. Therefore, before the signal voltage is written, an operation of holding the threshold voltage of the drive transistor 202 between the gate and the source of the drive transistor 202 may be performed. Such an operation is referred to as a threshold correction operation. With this threshold correction operation, the variation in the amount of current flowing through the drive transistor 202 in each pixel 102 is reduced, whereby uniform light emission is achieved.

In the threshold correction operation, after current flows to the light emitting element 201 via the light emission control transistor 204 and the drive transistor 202, the light emission control transistor 204 transitions to the non-conductive state. As a result, the current flows through the light emitting element 201 until the voltage between the gate and the source of the drive transistor 202 is stabilized, that is, until the voltage becomes a substantially constant value. Thus, the threshold correction is performed.

An example of a cross-sectional structure of the pixel 102 will be described with reference to FIG. 3. The light emitting apparatus 101 includes a substrate 301, an insulating layer 310, and the light emitting element 201. The insulating layer 310 is located on the substrate 301. The light emitting element 201 is located on the insulating layer 310. In other words, the insulating layer 310 is positioned between the substrate 301 and the light emitting element 201.

The substrate 301 has a principal surface 301a (upper surface in FIG. 3) on which the drive transistor 202, the write control transistor 203, and the light emission control transistor 204 are formed. The substrate 301 may be formed of, for example, a P-type semiconductor. An N-type well region 303 is formed on the principal surface 301a side of the substrate 301 (that is, on the upper side of the substrate 301). A portion of the substrate 301 other than the well region 303 is a P-type semiconductor region 302.

The substrate 301 has impurity regions 304, 305, and 306 in the well region 303. The impurity regions 304, 305, and 306 are all P-type. Electrodes 308 and 309 are formed on the principal surface 301*a* (upper surface) of the substrate 301. The electrode 308 functions as the gate of the light emission control transistor 204. The impurity regions 305 and 306 function as the two main terminals (source and drain) of the light emission control transistor 204. The electrode 309 functions as the gate of the drive transistor 202. The impurity regions 304 and 305 function as the two main terminals (source and drain) of the drive transistor 202.

The substrate 301 further includes an element isolation portion 307 formed between the adjacent pixels 102. As the element isolation portion 307, shallow trench isolation (STI), local oxidation of silicon (LOCOS) isolation, N-type diffusion layer isolation, or the like may be used.

The light emitting element 201 includes a cathode 321, an organic light emitting layer 322, and an anode 323. As described above, the cathode 321 is electrically connected to the power supply line 208. The anode 323 is electrically connected to the main terminal of the drive transistor 202. The organic light emitting layer 322 is located between the cathode 321 and the anode 323. A bank portion 324 is disposed at an end portion of the anode 323. The bank portion 324 prevents the current flowing between the anode 323 and the cathode 321 from leaking to the adjacent pixel 102.

A conductive pattern 311, a conductive pattern 312, the electrode 205*a*, the electrode 205*b*, the electrode 206*a*, the electrode 206*b*, and a plurality of plugs are embedded in the insulating layer 310. The insulating layer 310 may be, for example, silicon oxide. Each of the conductive patterns 311 and 312 forms a wiring layer. The height of the conductive pattern 311 from the principal surface 301*a* of the substrate 301 is smaller than the height of the conductive pattern 312 from the principal surface 301*a* of the substrate 301. In other words, the conductive pattern 311 is located closer to the principal surface 301*a* of the substrate 301 than the conductive pattern 312 is. The conductive pattern 311 and the conductive pattern 312 may have the same thickness or may have different thicknesses. For example, the conductive pattern 312 may be thicker than the conductive pattern 311. The plurality of plugs embedded in the insulating layer 310 may have the same thickness or may have different thicknesses.

The height of each of the electrode 205*a*, the electrode 205*b*, the electrode 206*a*, and the electrode 206*b* from the principal surface 301*a* of the substrate 301 is larger than the height of the conductive pattern 311 and smaller than the height of the conductive pattern 312. The electrode 205*a* and the electrode 205*b* face each other. Part of the insulating layer 310 is inserted between the electrode 205*a* and the electrode 205*b*. Thus, the capacitive element 205 having a Metal-Insulator-Metal (MIM) structure is formed. The electrode 206*a* and the electrode 206*b* face each other. Part of the insulating layer 310 is inserted between the electrode 206*a* and the electrode 206*b*. Thus, the capacitive element 206 having the MIM structure is formed.

In the description of the electrodes 205*a*, the surface on the upper side in FIG. 3 is referred to as the upper surface of the electrodes 205*a*, and the surface on the lower side in FIG. 3 is referred to as the lower surface of the electrodes 205*a*. The upper surface and the lower surface are located opposite to each other. The same applies to the electrode 205*b*, the electrode 206*a*, and the electrode 206*b*.

The electrode 205*a* (to be specific, the lower surfaces thereof) is connected to a conductive member in the conductive pattern 311 through a plug 316. The electrode 205*b* (to be specific, the upper surface thereof) is connected to a conductive member 315 in the conductive pattern 312 through a plug 317. The electrode 206*a* (to be specific, the lower surfaces thereof) is connected to a conductive member 313 in the conductive pattern 311 through a plug 319. The electrode 206*b* (to be specific, the upper surface thereof) is connected to a conductive member in the conductive pattern 312 through a plug 320. The conductive member 315 (specifically, the lower surface thereof) and the conductive member 313 (specifically, the upper surface thereof) are connected to each other by a plug 318. The electrode 205*a* is electrically connected to the electrode 309 (the gate of the drive transistor 202) and the impurity region 305 through the plugs 316 and the like. The electrode 205*b* is electrically connected to the electrode 206*a* through the conductive members 313 and 315 and the plugs 317, 318 and 319. The electrode 206*b* is electrically connected to the impurity region 306 through a conductive member 314, the plug 320, and the like. The conductive member 314 is included in the conductive pattern 311. The impurity region 306 corresponds to the node 211 in FIG. 2. Therefore, the impurity region 306 is electrically connected to power supply line 207.

Each of the electrodes 205*a* and 205*b* is located at a position overlapping the electrode 309 in plan view. Each of the electrodes 206*a* and 206*b* is located at a position overlapping the electrode 308 in plan view. The drive transistor 202 having the electrode 309 as the gate and the light emission control transistor 204 having the electrode 308 as the gate share the impurity region 305. Each of the conductive members 313 and 315 is located at a position overlapping the impurity region 305 in plan view.

With reference to FIG. 4, the arrangement of some components of the pixel 102 in plan view with respect to the principal surface 301*a* of the substrate 301 will be described. The plan view with respect to the principal surface 301*a* of the substrate 301 is hereinafter simply referred to as a plan view. In FIG. 4, attention is paid to the electrodes 205*a*, 205*b*, 206*a*, and 206*b* and the plugs 316 to 320. The cross-sectional view of FIG. 3 is taken along line A-A' in FIG. 4. The horizontal direction in FIG. 4 may be the row direction of the pixel array unit 103, and the vertical direction in FIG. 4 may be the column direction of the pixel array unit 103. Alternatively, the horizontal direction in FIG. 4 may be the column direction of the pixel array unit 103, and the vertical direction in FIG. 4 may be the row direction of the pixel array unit 103.

The arrangement of the electrode 205*a* and the electrode 205*b* of the capacitive element 205 will be described below. The electrode 206*a* and the electrode 206*b* of the capacitive element 206 may be similarly arranged. Each of the electrodes 205*a* and 205*b* has a plate shape extending in a direction parallel to the principal surface 301*a* of the substrate 301. The contour of each of the electrodes 205*a* and 205*b* is quadrangular in plan view. Alternatively, the contour of each of the electrodes 205*a* and 205*b* may be of other shapes.

In the example illustrated in FIG. 4, the electrode 205*a* is larger than the electrode 205*b* in plan view. Further, in plan view, the contour of the electrode 205*b* is included in the contour of the electrode 205*a*. Alternatively, the electrode 205*b* may protrude from the electrode 205*a* in plan view. In plan view, the electrode 205*a* may be smaller than the electrode 205*b*.

In plan view, the electrode 205*a* do not overlap any of the electrodes 206*a* and 206*b*. In plan view, the electrode 205*b* do not overlap any of the electrodes 206*a* and 206*b*. As illustrated in FIG. 3, the electrode 205*a* and the electrode 206*a* are at the same height from the principal surface 301*a* of the substrate 301. The electrode 205b and the electrode 206b are at the same height from the principal surface 301a of the substrate 301.

The arrangement of the electrode 205a, the electrode 205b, the electrode 206a, and the electrode 206b will be described more in detail with reference to FIG. 5A to FIG. 5C. FIG. 5A focuses on the arrangement of these electrodes in the light emitting apparatus 101 described with reference to FIG. 3 and FIG. 4. FIG. 5A illustrates a cross-sectional view at the same position as FIG. 3. FIG. 5B and FIG. 5C illustrate modifications of the arrangement in FIG. 5A.

As illustrated in FIG. 5A, the electrode 205b (in particular, the lower surfaces thereof) includes a portion 205c facing the electrode 205a. When the luminance signal is supplied to the control terminal of the drive transistor 202, the portion 205c of the electrode 205b is positively charged. Meanwhile, a portion of the electrode 205a facing the electrode 205b is negatively charged.

The electrode 206a includes a portion 206c with a shortest distance d1 to the electrode 205a being shorter than a shortest distance d2 to the portion 205c of the electrode 205b. The shortest distances d1 and d2 are distances obtained by connecting two points in the three dimensional space with a straight line. The portion 206c is included in a side surface of the electrodes 206a. The portion 206c faces a side surface of the electrode 205a. Due to such a distance relationship, a parasitic capacitance 500 is generated between the electrode 205a and the electrode 206a. That is, the portion 206c of the electrode 206a is positively charged, and the portion of the electrode 205a facing the electrode 206a is negatively charged. The parasitic capacitance 500 increases the capacitance value of the capacitive element 205. With the increase in the capacitance value between the gate and the source of the drive transistor 202, a change in the luminance signal due to a leakage current flowing into the capacitive element 205 is reduced.

In the example illustrated in FIG. 3 and FIG. 4, the plug 318 is located between the electrode 205a and the electrode 206a. With the plug 318 thus located further increases the parasitic capacitance 500 between the electrode 205a and the electrode 206a. Alternatively, the plug 318 may be at other locations.

Next, modifications of the arrangement in FIG. 5A will be described with reference to FIG. 5B and FIG. 5C. In the example illustrated in FIG. 5B, the electrode 205b extends from the position overlapping the electrode 205a in plan view toward the electrode 206a. Further, the electrodes 206a and 206b are shifted downward in the figure. Even with such an arrangement, the shortest distance d1 from the portion 206c of the electrode 206a to the electrode 205a is shorter than the shortest distance d2 from the portion 206c of the electrode 206a to the portion 205c of the electrode 205b. Thus, a parasitic capacitance 510 is generated between the electrode 205a and the electrode 206a. The plug 318 may be located on a side of the electrode 206a or may be formed through an opening formed in the electrode 206a. Alternatively, the plug 318 may be connected to the upper surface of the electrode 206a.

In the example illustrated in FIG. 5C, the height of the electrode 205a from the principal surface 301a of the substrate 301 is larger than the height of the electrode 206a from the principal surface 301a of the substrate 301. The height of the electrode 205b from the principal surface 301a of the substrate 301 is larger than the height of the electrode 206b from the principal surface 301a of the substrate 301. The electrode 206a extends from a position overlapping the electrodes 206b in plan view toward the capacitive element 205. The electrode 206a partially overlaps the electrode 205a in plan view.

Also in the example illustrated in FIG. 5C, the electrode 206a includes the portion 206c with the shortest distance d1 to the electrode 205a being shorter than the shortest distance d2 to the portion 205c of the electrode 205b. Specifically, the lower surface of the electrode 205a includes a portion facing the portion 206c of the electrode 206a, and this portion is negatively charged. In the example illustrated in FIG. 5C, a parasitic capacitance 520 is generated between the electrode 205a and the electrode 206a. The plug 318 may be located on a side of the electrode 206a or may be formed through an opening formed in the electrode 206a. Alternatively, the plug 318 may be connected to the upper surface of the electrode 206a.

Second Embodiment

An example of a configuration of a light emitting apparatus 101 according to a second embodiment will be described with reference to FIG. 6. In the following, differences from the first embodiment will be mainly described. Matters not described in the second embodiment may be the same as those in the first embodiment. Also in the second embodiment, the modifications described with reference to FIG. 5B and FIG. 5C can be applied.

FIG. 6 illustrates a cross-sectional view corresponding to FIG. 3. In the first embodiment, the conductive member 313 does not overlap the electrode 205a in plan view. As described above, the conductive member 313 is included in the conductive pattern 311. The conductive member 313 electrically connects the electrode 205b and the electrode 206a to each other. In the second embodiment, the conductive member 313 extends toward the electrode 205a. In plan view, the conductive member 313 includes a portion facing the electrode 205a (specifically, the lower surface thereof). In this arrangement, the parasitic capacitance between the electrode 205a and the conductive member 313 is larger than that in the first embodiment. This parasitic capacitance further increases the capacitance value of the capacitive element 205.

Third Embodiment

An example of a configuration of a light emitting apparatus 101 according to a third embodiment will be described with reference to FIG. 7. In the following, differences from the second embodiment will be mainly described. Matters not described in the third embodiment may be the same as those in the first embodiment or the second embodiment. Also in the third embodiment, the modifications described with reference to FIG. 5B and FIG. 5C can be applied. The difference between the second embodiment and the third embodiment may be applied to the first embodiment.

FIG. 7 illustrates a cross-sectional view corresponding to FIG. 6. In the second embodiment, the conductive member 314 does not overlap the electrode 206a in plan view. As described above, the conductive member 314 is included in the conductive pattern 311. The conductive member 314 electrically connects the electrode 206b and the power supply line 208 to each other. In the third embodiment, the conductive member 314 extends toward the electrode 206a. In plan view, the conductive member 314 includes a portion facing the electrode 206a (specifically, the lower surface thereof). In this arrangement, the parasitic capacitance between the electrode 206a and the conductive member 314 is larger than that in the second embodiment. Thus, the capacitance between the source and drain of the light emission control transistor 204 can be increased. During the threshold value correction, the light emission control transistor 204 is in the non-conductive state, and thus the source of the drive transistor 202 is in a floating state. Therefore, the source of the drive transistor 202 is likely to be affected by voltage fluctuation due to noise, and as a result, the threshold may fail to be normally corrected. According to the third embodiment, since the capacitance between the source and the drain of the light emission control transistor 204 can be increased, a voltage fluctuation due to noise can be suppressed.

Fourth Embodiment

An example of a configuration of a light emitting apparatus 101 according to a fourth embodiment will be described with reference to FIG. 8 to FIG. 10. In the following, differences from the third embodiment will be mainly described. Matters not described in the fourth embodiment may be the same as those in any of the first embodiment to the third embodiment.

An example of an overall configuration of a light emitting apparatus 101 according to the fourth embodiment will be described with reference to FIG. 8. In the fourth embodiment, the pixel array unit 103 of the light emitting apparatus 101 is further provided with a plurality of scanning lines 801. Each of the plurality of scanning lines 801 extends in the row direction. The plurality of scanning lines 106 may correspond one-to-one to a plurality of pixel rows of the pixel array unit 103. The vertical scanning circuit 104 supplies a reset signal to the pixel 102 through the scanning line 801. The reset signal is a signal for resetting the light emitting element 201 of the pixel 102. The vertical scanning circuit 104 further includes an output terminal connected to the scanning line 801 for each pixel row.

An example of a circuit configuration of the pixel 102 according to the fourth embodiment will be described with reference to FIG. 2. The pixel 102 further includes a reset transistor 901 and a power supply line 903. The reset transistor 901 is a transistor for resetting the light emitting element 201. The reset transistor 901 may be, for example, a P-type transistor.

A control terminal (for example, gate) of the reset transistor 901 receives the reset signal. The reset transistor 901 has one terminal (for example, a source) connected to a node 902 on a path between the light emitting element 201 and the drive transistor 202. In the example illustrated in FIG. 9, the reset transistor 901 has one terminal connected to each of the anode of the light emitting element 201 and the main terminal of the drive transistor 202. The reset transistor 901 has the other terminal (drain for example) connected to the power supply line 903. The power supply line 903 supplies a power supply voltage Vres. The power supply voltage Vres is a voltage at which the luminance of the light emitting element 201 is at a black level. The power supply voltage Vres and the power supply voltage Vss may be the same value or may be different values.

In the non-light emission period, when the reset transistor 901 transitions to the conductive state, the anode of the light emitting element 201 is connected to the power supply line 903, and the two electrodes of the light emitting element 201 are short-circuited. Thus, the light emitting element 201 can transition to the non-light emission state (reset operation). With the reset transistor 901 provided to the pixel 102, the light emitting element 201 reliably performs black display in the non-light emission period, whereby the light emitting apparatus 101 having a high contrast ratio is obtained.

An example of a cross-sectional structure of the pixel 102 according to the fourth embodiment will be described with reference to FIG. 10. The substrate 301 further includes an impurity region 1001 in the well region 303. The impurity region 1001 is P-type. An electrode 1002 is further formed on the principal surface 301*a* of the substrate 301. The electrode 1002 functions as the gate of the reset transistor 901. The impurity regions 304 and 1001 function as two main terminals (source and drain) of the reset transistor 901.

A conductive pattern 1003 is further embedded in the insulating layer 310. The conductive pattern 1003 forms a wiring layer. The height of the conductive pattern 1003 from the principal surface 301*a* of the substrate 301 is smaller than the height of the conductive pattern 311 from the principal surface 301*a* of the substrate 301. With the conductive pattern 1003 further provided, a plurality of transistors as well as gate wiring for driving them can be easily mounted within a predetermined pixel size.

[Configuration of Organic Light Emitting Element]

An organic light emitting element is provided by forming an insulating layer, a first electrode, an organic compound layer, and a second electrode on a substrate. A protective layer, a color filter, a microlens, and the like may be provided on the cathode. When the color filter is provided, a planarization layer may be provided between the color filter and the protective layer. The planarization layer can be made of acrylic resin or the like. The same applies to a case where the planarization layer is provided between the color filter and the microlens.

[Substrate]

Examples of the substrate include quartz, glass, a silicon wafer, a resin, a metal, and the like. Further, a switching element such as a transistor or wiring may be provided over the substrate, and an insulating layer may be provided thereover. As the insulating layer, any material may be used as long as a contact hole can be formed so that wiring can be formed between the insulating layer and the first electrode, and insulation from unconnected wiring can be guaranteed. For example, a resin such as polyimide, silicon oxide, silicon nitride, or the like can be used.

[Electrode]

A pair of electrodes can be used as the electrode. The pair of electrodes may be an anode and a cathode. When an electric field is applied in a direction in which the organic light emitting element emits light, an electrode having a higher potential serves as the anode and the other electrode serves as the cathode. It can also be said that the electrode supplying holes to the light emitting layer serves as the anode and the electrode supplying electrons to the light emitting layer serves as the cathode.

A material used as the anode preferably has a work function as large as possible. For example, a metal element such as gold, platinum, silver, copper, nickel, palladium, cobalt, selenium, vanadium, or tungsten, a mixture containing these elements, an alloy of these elements, or a metal oxide such as tin oxide, zinc oxide, indium oxide, indium tin oxide (ITO), or indium zinc oxide can be used. Conductive polymers such as polyaniline, polypyrrole, and polythiophene can also be used.

These electrode materials may be used alone or in combination of two or more types thereof. Further, the anode may include a single layer or a plurality of layers.

In the case of being used as a reflective electrode, chromium, aluminum, silver, titanium, tungsten, molybdenum, an alloy thereof, a stacked layer thereof, or the like can be used for example. With the above materials, it is possible to function as a reflective film which does not function as an electrode. In the case of being used as a transparent electrode, an oxide transparent conductive layer such as indium tin oxide (ITO) or indium zinc oxide can be used, but this should not be construed in a limiting sense. The electrodes can be formed using a photolithography technique.

On the other hand, a material forming the cathode preferably has a small work function. For example, a metal simple substance such as an alkali metal such as lithium, an alkaline earth metal such as calcium, aluminum, titanium, manganese, silver, lead, or chromium, or a mixture thereof may be used. Alternatively, an alloy obtained by combining these simple metals may be used. For example, magnesium-silver, aluminum-lithium, aluminum-magnesium, silver-copper, zinc-silver and the like can be used. Metal oxides such as indium tin oxide (ITO) can also be used. These electrode materials may be used alone or in combination of two or more types thereof. The cathode may have a single-layer structure or a multi-layer structure. Among them, silver is preferably used, and a silver alloy is more preferably used in order to reduce aggregation of silver. The ratio of the alloy is not limited as long as the aggregation of silver can be reduced. For example, the ratio between silver and the other metal may be 1:1, 3:1, or the like.

The cathode may be a top emission element using an oxide conductive layer such as ITO, or a bottom emission element using a reflective electrode such as aluminum (Al), and is not particularly limited. Although there is no particular limitation on the method for forming the cathode, it is preferable to use a direct current or alternating current sputtering method or the like with which excellent coverage of the film is achieved and the resistance can be easily reduced.

[Pixel Separation Layer]

A pixel separation layer is formed of a silicon nitride (SiN) film, a silicon oxynitride (SiON) film, or a silicon oxide (SiO) film formed using a chemical vapor deposition method (CVD method). In order to increase the resistance of the organic compound layer in the in-plane direction, it is preferable that the organic compound layer, in particular, the hole transport layer is formed to be thin on the side wall of the pixel separation layer. Specifically, by increasing the taper angle of the side wall of the pixel separation layer or the film thickness of the pixel separation layer to increase vignetting at the time of vapor deposition, the side wall can be formed to be thin.

Meanwhile, it is preferable to adjust the side wall taper angle and the thickness of the pixel separation layer to such an extent that no void is formed in the protective layer formed on the pixel separation layer. Since no void is formed in the protective layer, occurrence of defects in the protective layer can be reduced. Since the occurrence of defects in the protective layer is reduced, it is possible to reduce a decrease in reliability due to generation of dark spots, occurrence of conduction failure of the second electrode, and the like.

According to the present embodiment, it is possible to effectively suppress the charge leakage to the adjacent pixel, even if the taper angle of the side wall of the pixel separation layer is not sharp. As a result of this study, it was found that the taper angle can be sufficiently reduced when the taper angle is in a range of 60 degrees or more and 90 degrees or less. The thickness of the pixel separation layer is preferably not less than the 10 nm and not more than the 150 nm. In addition, the same effect can also be obtained with a configuration only including a pixel electrode without the pixel separation layer. However, in this case, it is preferable that the film thickness of the pixel electrode is half or less of that of the organic layer, or the end portion of the pixel electrode is forward tapered at an angle of less than 60°, so that the short circuiting of the organic light emitting element can be reduced.

[Organic Compound Layer]

The organic compound layer may include a single layer or multiple layers. In the case of multiple layers, the layers may be referred to as a hole injection layer, a hole transport layer, an electron blocking layer, a light emitting layer, a hole blocking layer, an electron transport layer, and an electron injection layer depending on their functions. The organic compound layer is mainly composed of an organic compound, but may contain an inorganic atom or an inorganic compound. For example, copper, lithium, magnesium, aluminum, iridium, platinum, molybdenum, zinc, and the like may be contained. The organic compound layer may be disposed between the first electrode and the second electrode, or may be disposed to be in contact with the first electrode and the second electrode.

[Protective Layer]

A protective layer may be provided on the cathode. For example, when glass provided with a moisture absorbent is bonded to the cathode, entry of water or the like into the organic compound layer can be reduced and occurrence of display defects can be reduced. In another embodiment, a passivation film made of silicon nitride or the like may be provided on the cathode to reduce the penetration of water or the like into the organic compound layer. For example, after the cathode is formed, the cathode may be transferred to another chamber without breaking vacuum, and a silicon nitride film having a thickness of 2 μm may be formed as the protective layer by a CVD method. A protective layer formed by an atomic layer deposition method (ALD method) may be provided after film formation by a CVD method. The material of the film formed by the ALD method is not limited, and may be silicon nitride, silicon oxide, aluminum oxide, or the like. Silicon nitride may be further formed by the CVD method, on the film formed by the ALD method. The film formed by the ALD method may have a smaller thickness than the film formed by the CVD method. Specifically, it may be 50% or less, further 10% or less.

[Color Filter]

A color filter may be provided on the protective layer. For example, a color filter in consideration of the size of the organic light emitting element may be provided over another substrate and bonded to the substrate provided with the organic light emitting element, or a color filter may be patterned over the above-described protective layer using a photolithography technique. The color filter may be composed of a polymer.

[Planarization Layer]

A planarization layer may be provided between the color filter and the protective layer. The planarization layer is provided for the purpose of reducing unevenness of a lower layer. Without limiting the purpose, it may be referred to as a material resin layer. The planarization layer may be composed of an organic compound that may be a low molecular compound or a high molecular compound but is preferably a high molecular compound.

The planarization layers may be provided above and below the color filter, and may be made of the same material or different materials. Specific examples thereof include a polyvinyl carbazole resin, a polycarbonate resin, a polyester resin, an ABS resin, an acrylic resin, a polyimide resin, a phenol resin, an epoxy resin, a silicon resin, a urea resin, and the like.

[Microlens]

The organic light emitting apparatus may have an optical member such as a microlens on the light emitting side thereof. The microlens may be made of acrylic resin, epoxy resin, or the like. The microlens may be provided for the purpose of increasing the amount of light extracted from the organic light emitting apparatus and controlling the direction of the extracted light. The microlens may have a hemispherical shape. In the case where the microlens has a hemispherical shape, tangent lines in contact with the hemisphere include a tangent line parallel to the insulating layer, and a contact point between the tangent line and the hemisphere corresponds to a vertex of the microlens. The apex of the microlens can be similarly determined in any cross-sectional view. In other words, tangent lines in contact with the semicircle of the microlens in the cross-sectional view include a tangent line parallel to the insulating layer, and a contact point between the tangent line and the semicircle corresponds to a vertex of the microlens.

It is also possible to define the midpoint of the microlens. In a cross section of the microlens, the midpoint of a virtual line segment from a point at which the shape of a circular arc ends to a point at which the shape of another circular arc ends can be referred to as the midpoint of the microlens. The cross section for determining the apex and the midpoint may be a cross section orthogonal to the insulating layer.

The microlens has a first surface having a convex portion and a second surface opposite to the first surface. The second surface is preferably disposed closer to the functional layer than the first surface is. To achieve such a configuration, it is necessary to form a microlens on the light emitting apparatus. When the functional layer is an organic layer, the manufacturing process preferably involves no high-temperature process. In the case of the configuration in which the second surface is disposed closer to the functional layer than the first surface is, all the organic compounds constituting the organic layer preferably have a glass transition temperature of 100° ° C. or higher, more preferably 130° C. or higher.

[Counter Substrate]

A counter substrate may be provided on the planarization layer. The counter substrate is provided at a position corresponding to the above-described substrate, and thus is referred to as a counter substrate. The counter substrate may be formed of a material that is the same as that of the substrate described above. The counter substrate may be a second substrate when the above-described substrate is a first substrate.

[Organic Layer]

An organic compound layer (such as a hole injection layer, a hole transport layer, an electron blocking layer, a light emitting layer, a hole blocking layer, an electron transport layer, and an electron injection layer) forming the organic light emitting element according to one embodiment of the present invention is formed by the following method.

The organic compound layer forming the organic light emitting element according to one embodiment of the present invention may be formed by a dry process such as a vacuum deposition method, an ionization deposition method, sputtering, or plasma. Instead of the dry process, it is also possible to use a wet process in which a layer is formed by a known coating method (such as, for example, spin coating, dipping, a cast method, an LB method, and an ink jet method), with the compound dissolved in an appropriate solvent.

Here, when the layer is formed by a vacuum deposition method, a solution coating method, or the like, excellent stability over time is achieved since crystallization or the like hardly occurs. When a film is formed by a coating method, the film may be formed in combination with an appropriate binder resin.

Specific examples of the binder resin described above include a polyvinyl carbazole resin, a polycarbonate resin, a polyester resin, an ABS resin, an acrylic resin, a polyimide resin, a phenol resin, an epoxy resin, a silicon resin, a urea resin, and the like, but the binder resin is not limited to these.

One type of these binder resins may be used alone as a homopolymer or a copolymer, or two or more types thereof may be mixed and used. Further, if necessary, known additives such as a plasticizer, an antioxidant and an ultraviolet absorber may be used in combination.

[Pixel Circuit]

The light emitting apparatus may include a pixel circuit connected to the light emitting element. The pixel circuit may be an active matrix type that controls light emission of the first light emitting element and the second light emitting element independently of each other. The active matrix circuit may be voltage-programmed or current-programmed. The driving circuit includes a pixel circuit for each pixel. The pixel circuit may include a light emitting element, a transistor for controlling the luminance of light emitted from the light emitting element, a transistor for controlling light emission timing, a capacitor for holding a gate voltage of the transistor for controlling light emission luminance, and a transistor for connection to GND without the light emitting element provided in between.

The light emitting apparatus includes a display region and a peripheral region disposed around the display region. The display region includes a pixel circuit, and the peripheral region includes a display control circuit. The mobility of the transistor forming the pixel circuit may be lower than the mobility of the transistor forming the display control circuit.

The slope of the current-voltage characteristic of the transistor constituting the pixel circuit may be smaller than the slope of the current-voltage characteristic of the transistor constituting the display control circuit. The slope of the current-voltage characteristic can be measured using what is known as a Vg-Ig characteristic.

The transistor forming the pixel circuit is a transistor connected to a light emitting element such as the first light emitting element.

[Pixel]

The organic light emitting apparatus includes a plurality of pixels. The pixel includes subpixels that emit light of colors different from each other. The subpixels may each have emission colors of RGB, for example.

In the pixel, a region, known as a pixel aperture, emits light. This region is the same as the first region. The pixel aperture may be 15 μm or less and may be 5 μm or more. More specifically, it may be 11 μm, 9.5 μm, 7.4 μm, 6.4 μm, or the like.

The distance between the subpixels may be 10 μm or less, and specifically, may be 8 μm, 7.4 μm, or 6.4 μm.

The pixels may be arranged in a known manner in plan view. For example, it may be a stripe arrangement, a delta arrangement, a pentile arrangement, or a Bayer arrangement. The shape of the subpixel in plan view may be any known shape. For example, the shape may be a quadrangle such as a rectangle or a rhombus, or a hexagon. Of course, rectangle includes a shape that is not precisely rectangular, but is close to a rectangle. The shape of the subpixel and the pixel arrangement can be used in combination.

[Application of Organic Light Emitting Element According to One Embodiment of the Present Invention]

The organic light emitting element according to one embodiment of the present invention may be used as a component of a display apparatus or an illumination apparatus. Other applications include an exposure light source of an electrophotographic image forming apparatus, a backlight of a liquid crystal display apparatus, a light emitting apparatus including a white light source and a color filter, and the like.

The display apparatus may be an image information processing apparatus that has an image input unit for inputting image information from an area CCD, a linear CCD, a memory card, or the like, has an information processing unit for processing the input information, and displays the input image on the display unit.

The display unit included in an image capturing apparatus or an inkjet printer may have a touch panel function. A driving method for the touch panel function may be an infrared method, a capacitance method, a resistance film method, or an electromagnetic induction method, and is not particularly limited. Further, the display apparatus may be used as a display unit of a multifunction printer.

Now, a display apparatus according to the present embodiment will be described with reference to the drawings. In the following embodiments, the display apparatus may include the light emitting apparatus (for example, the light emitting apparatus 101) according to any of the embodiments described above.

FIG. 11A to FIG. 11B are schematic cross-sectional views illustrating an example of a display apparatus including an organic light emitting element and a transistor connected to the organic light emitting element. A transistor is an example of an active element. The transistor may be a thin film transistor (TFT).

FIG. 11A illustrates an example of a pixel which is a component of the display apparatus according to the present embodiment. The pixel includes subpixels 1100. The subpixels are classified into 1100R, 1100G, and 1100B according to the light emitted therefrom. The color of light emitted may be distinguished by the wavelength of light emitted from the light emitting layer, or light emitted from the subpixel may be selectively transmitted or subjected to color conversion by a color filter or the like. Each subpixel includes, on an interlayer insulating layer 1101, a reflective electrode 1102 serving as the first electrode, an insulating layer 1103 covering an end of the reflective electrode 1102, an organic compound layer 1104 covering the first electrode and the insulating layer, a second electrode 1110, a protective layer 1111, and color filters 1112.

A transistor or a capacitive element may be provided under or inside the interlayer insulating layer 1101. The transistor and the first electrode may be electrically connected to each other via a contact hole (not illustrated) or the like.

The insulating layer 1103 is also called a bank or a pixel separation film. It is disposed to cover the end of the first electrode and surround the first electrode. A portion where the insulating layer is not disposed is in contact with the organic compound layer 1104 and serves as a light emitting region.

The organic compound layer 1104 includes a hole injection layer 1105, a hole transport layer 1106, a first light emitting layer 1107, a second light emitting layer 1108, and an electron transport layer 1109. The second electrode 1110 may be a transparent electrode, a reflective electrode, or a semi-transmissive electrode. The protective layer 1111 reduces permeation of moisture into the organic compound layer. The protective layer is illustrated as a single layer, but may be multiple layers. Each layer may include an inorganic compound layer or an organic compound layer.

The color filters 1112 are classified into 1112R, 1112G, and 1112B according to its color. The color filter may be formed on a planarization film (not illustrated). Further, a resin protective layer (not illustrated) may be provided on the color filter. Furthermore, the color filter may be formed on the protective layer 1111. Alternatively, it may be provided on a counter substrate such as a glass substrate and then bonded.

For a display apparatus 1150 in FIG. 11B, an organic light emitting element 1166 and a TFT 1158 as an example of a transistor is illustrated. A substrate 1151 made of glass, silicon or the like and an insulating layer 1152 on top of it are provided. An active element 1158 such as a TFT is arranged on the insulating layer, and a gate electrode 1153 of the active element, a gate insulating film 1154, and a semiconductor layer 1155 are arranged. The TFT 1158 further includes a semiconductor layer 1155, a drain electrodes 1156, and a source electrode 1157. An insulating film 1159 is provided at a portion above, the TFT 1158. An anode 1161 and a source electrode 1157 forming the organic light emitting element 1166 are connected to each other through a contact hole 1160 provided in the insulating film.

How the electrical connection is achieved between the electrodes (anodes and cathodes) included in the organic light emitting elements 1166 and the electrodes (source electrodes and drain electrodes) included in the TFTs is not limited to what is illustrated in FIG. 11B. That is, any one of the anode and the cathode may be electrically connected to any one of the source electrode and the drain electrode of the TFT. TFT is short for thin film transistor.

Although the organic compound layer is illustrated as one layer in the display apparatus 1150 in FIG. 11B, the organic compound layer 1162 may include multiple layers. A first protective layer 1164 and a second protective layer 1165 for suppressing deterioration of the organic light emitting element are provided on a cathode 1163. Although the transistor is used as the switching element in the display apparatus 1150 in FIG. 11B, other switching elements may be used instead.

The transistor used for the display apparatus 1150 in FIG. 11B is not limited to a transistor using a single crystal silicon wafer, and may be a thin film transistor having an active layer on an insulating substrate. Examples of the active layer include: non-single-crystal silicon such as single-crystal silicon, amorphous silicon, and microcrystalline silicon; and non-single-crystal oxide semiconductors such as indium zinc oxide and indium gallium zinc oxide. The thin film transistor is also referred to as a TFT element.

The transistor included in the display apparatus 1150 in FIG. 11B may be formed in a substrate such as a Si substrate. This expression "formed in a substrate" means that a transistor is manufactured by processing a substrate such as a Si substrate itself. Thus, when a transistor is included in a substrate, the substrate and the transistor can be regarded as being integrally formed.

The luminance of light emitted from the organic light emitting element according to the present embodiment is controlled by a TFT which is an example of a switching element, and by providing a plurality of organic light emitting elements in a plane, it is possible to display an image based on the luminance of light emitted from each element. The switching element according to the present embodiment is not limited to a TFT, and may be a transistor formed of low-temperature polysilicon or an active matrix driver formed on a substrate such as a Si substrate. This expression "on the substrate" can also be construed as "in the substrate". Whether the transistor is provided in the substrate or the TFT is used is selected depending on the size of the display unit, and for example, if the size is about 0.5 inches, it is preferable to provide the organic light emitting element on the Si substrate.

FIG. 12 is a schematic diagram illustrating an example of a display apparatus according to the present embodiment. A display apparatus 1200 may include, between an upper cover 1201 and a lower cover 1209, a touch panel 1203, a display panel 1205, a frame 1206, a circuit board 1207, and a battery 1208. The touch panel 1203 and the display panel 1205 have flexible printed circuits FPC 1202 and 1204 connected thereto. The circuit board 1207 has a transistor printed thereon. The battery 1208 need not be provided when the display apparatus is not a portable apparatus, or may be provided at another position when the display apparatus is a portable apparatus.

The display apparatus according to the present embodiment may include a color filter having red, green and blue color. The color filter may have the red, green and blue color elements arranged in a delta array.

The display apparatus according to the present embodiment may be used for a display unit of a mobile terminal. In such a case, the display apparatus may have both a display function and an operating function. The mobile terminal may be a mobile phone such as a smartphone, a tablet, a head-mounted display, or the like.

The display apparatus according to the present embodiment may be used for a display unit of an image capturing apparatus including an optical unit including a plurality of lenses, and an image capturing element that receives light passing through the optical unit. The image capturing apparatus may include a display unit configured to display information acquired by the image capturing elements. In addition, the display unit may be a display unit exposed outside the image capturing apparatus, or a display unit provided within a viewfinder. The image capturing apparatus may be a digital camera, or a digital video camera.

FIG. 13A is a schematic diagram illustrating an example of an image capturing apparatus according to the present embodiment. An image capturing apparatus 1300 may include a view finder 1301, a rear display 1302, an operation unit 1303, and a housing 1304. The view finder 1301 may include the display apparatus according to the present embodiment. In such a case, the display apparatus may display not only images being captured but also environment information, image capturing instruction, or the like. The environment information may be intensity of ambient light, orientation of ambient light, movement speed of the subject, possibility of the subject being shielded by a shielding object, or the like.

The timing suitable for image capturing is short-lived, and therefore the information should be displayed as soon as possible. Thus, it is preferable to use the display apparatus using the organic light emitting element of the present invention. This is because the response speed of the organic light emitting element is generally fast. The display apparatus using the organic light emitting element may be used for an apparatus that prioritizes display speed, more preferably than liquid crystal display apparatuses.

The image capturing apparatus 1300 includes an optical unit (not illustrated). The optical unit includes a plurality of lenses, and forms a subject image on an image capturing element accommodated within the housing 1304. The plurality of lenses can adjust the focus by adjusting their relative positions. The operation can be automatically performed. The image capturing apparatus may also be referred to as a photoelectric conversion apparatus. The photoelectric conversion apparatus can include a method of detecting a difference from a preceding image, a method of cutting out an image from images constantly being recorded, or the like, as a method of image capturing, instead of performing sequential image capturing.

FIG. 13B is a schematic diagram illustrating an example of an electronic device according to the present embodiment. An electronic device 1350 includes a display unit 1351, an operation unit 1352, and a housing 1353. The housing 1353 may include a circuit, a print circuit board including the circuit, a battery, and a communication unit. The operation unit 1352 may be a button, or a reaction unit of a touch panel type. The operation unit may be a biometric recognition unit that recognizes a fingerprint to release a lock, or the like. The electronic device including the communication unit may also be referred to as a communication apparatus. The electronic device may include a lens and an image capturing element to further provide a camera function. An image captured by the camera function is displayed on the display unit. The electronic device may be a smartphone, a notebook-type personal computer, or the like.

FIG. 14A and FIG. 14B are schematic diagrams illustrating examples of the display apparatus according to the present embodiment. FIG. 14A illustrates a display apparatus such as a TV monitor or a PC monitor. The display apparatus 1400 includes a frame 1401 and a display unit 1402. The light emitting apparatus according to the present embodiment may be used in the display unit 1402.

A base 1403 is provided that supports the frame 1401 and the display unit 1402. The base 1403 is not limited to the form of FIG. 14A. The lower edge of the frame 1401 may also serve as a base.

In addition, the frame 1401 and the display unit 1402 may be curved. The radius of curvature is preferably equal to or larger than 5000 mm and equal to or smaller than 6000 mm.

FIG. 14B is a schematic diagram illustrating another example of the display apparatus according to the present embodiment. The display apparatus 1450 of FIG. 14B, being configured to be foldable, is what is known as a foldable display apparatus. The display apparatus 1450 includes a first display unit 1451, a second display unit 1452, a housing 1453, and a bent point 1454. The light emitting apparatus according to the present embodiment may be included in the first display unit 1451 and the second display unit 1452. The first display unit 1451 and the second display unit 1452 may be a seamless monolithic display apparatus. The first display unit 1451 and the second display unit 1452 can be separated at a bent point. The first display unit 1451 and the second display unit 1452 may respectively display different images, or the first and second display units may display a single image together.

FIG. 15A is a schematic diagram illustrating an example of an illumination apparatus according to the present embodiment. The illumination apparatus 1500 may include a housing 1501, a light source 1502, a circuit board 1503, an optical film 1504, and a light diffusing unit 1505. The light source may include the organic light emitting element according to the present embodiment. The optical filter may be a filter that improves the color rendering properties of the light source. The light diffusing unit can effectively diffuse the light of the light source and deliver the light to a wide range, through light up or the like. The optical filter and the light diffusing unit may be provided on the light emission side of the illumination. If necessary, a cover may be provided on the outermost portion.

The illumination apparatus is, for example, a apparatus for illuminating a room. The illumination apparatus may emit white light, neutral white light, or any other color from blue to red. A dimming circuit for dimming them may be provided. The illumination apparatus may have the organic light emitting element of the present invention and a power supply circuit connected thereto. The power supply circuit is a circuit that converts an AC voltage into a DC voltage. Further, white has a color temperature of 4200 K, and neutral white has a color temperature of 5000 K. The illumination apparatus may include color filter.

In addition, the illumination apparatus according to the present embodiment may include a heat radiation unit. The heat radiation unit radiates heat inside the apparatus to the outside of the apparatus, and examples thereof include a metal having a high specific heat, liquid silicon, and the like.

FIG. 15B is a schematic diagram illustrating an automobile that is an example of a moving body according to the present embodiment. The automobile includes a tail lamp which is an example of a lamp. An automobile 1550 may have a tail lamp 1551, and the tail lamp may be turned on when a brake operation or the like is performed.

The tail lamp 1551 may include the organic light emitting element according to the present embodiment. The tail lamp may include a protective member that protects the organic EL element. The protective member may be made of any material as long as it has a high strength of a certain level and is transparent, but is preferably made of polycarbonate or the like. The polycarbonate may be mixed with a furandicarboxylic acid derivative, an acrylonitrile derivative, or the like.

The automobile 1550 may have a body 1553 and a window 1552 attached thereto. The window may be a transparent display if it is not a window for viewing the front and back of the automobile. The transparent display may comprise the organic light emitting element according to the present embodiment. In this case, a component of an electrode or the like included in the organic light emitting element is formed of a transparent member.

The moving body according to the present embodiment may be a ship, an aircraft, a drone, or the like. The moving body may include a body and a lamp provided in the body. The lamp may emit light to indicate the position of the body. The lamp includes the organic light emitting element according to the present embodiment.

Figure 16A:
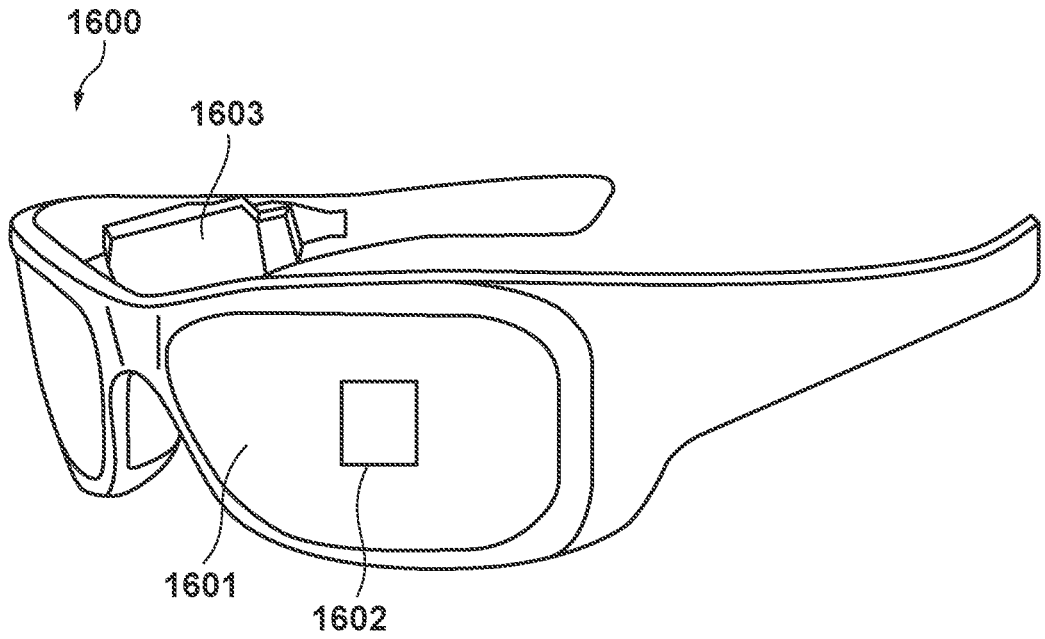
FIG. 16A and FIG. 16B are diagrams illustrating an example of a wearable device using the light emitting apparatus according to the embodiment described above.
Figure 16B:
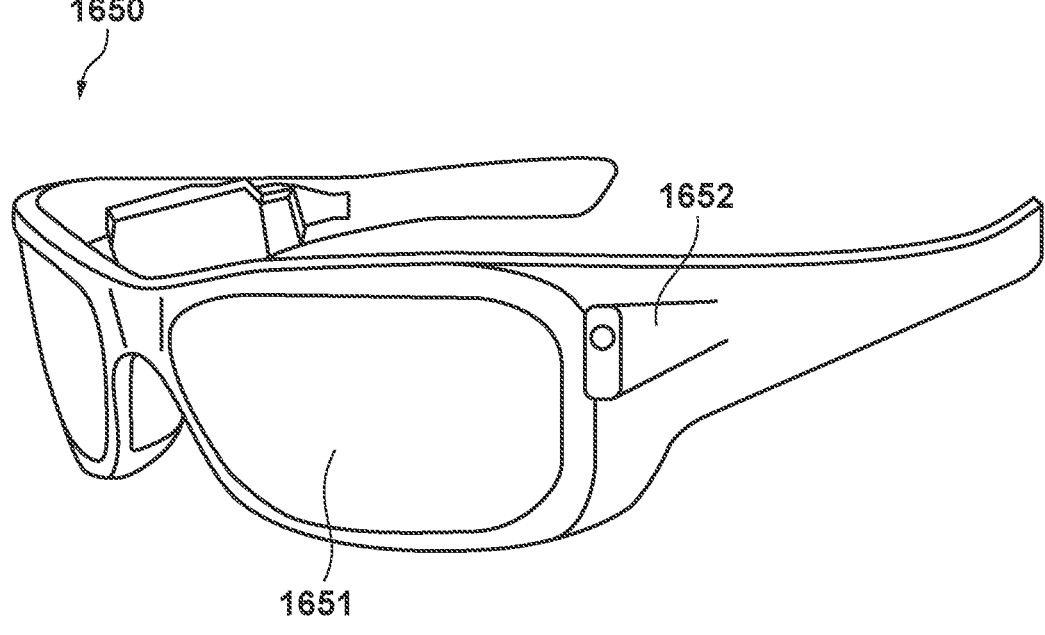

Referring to FIG. 16A and FIG. 16B, an example of application of the display apparatus according to each of the embodiments described above will be described. The display apparatus may be applied to a system that can be worn as a wearable device such as, for example, smart glasses, an HMD, and smart contact lenses. An image capturing and displaying apparatus used in such an application example includes an image capturing apparatus that can photoelectrically convert visible light, and a display apparatus that can emit visible light.

FIG. 16A illustrates eyeglasses 1600 (smart glasses) according to one application example. An image capturing apparatus 1602 such as a CMOS sensor or an SPAD is provided on the front surface side of a lens 1601 of the eyeglasses 1600. In addition, the display apparatus according to each of the embodiments described above is provided on the back surface side of the lens 1601.

The eyeglasses 1600 further includes a control apparatus 1603. The control apparatus 1603 functions as a power source that supplies power to a display apparatus including the image capturing apparatus 1602 and the display apparatus according to respective embodiments. The control apparatus 1603 controls the operation of the image capturing apparatus 1602 and the display apparatus. The lens 1601 has formed thereon an optical system for focusing light on the image capturing apparatus 1602.

FIG. 16B illustrates eyeglasses 1650 (smart glasses) according to one application example. The eyeglasses 1650 include a control apparatus 1652. An image capturing apparatus corresponding to the image capturing apparatus 1602, and a display apparatus are mounted on the control apparatus 1652. The lens 1651 has formed thereon an image capturing apparatus within the control apparatus 1652 and an optical system for projecting light emitted from the display apparatus, and an image is projected on the lens 1651. The control apparatus 1652 functions as a power source for supplying power to the image capturing apparatus and the display apparatus, and also controls the operation of the image capturing apparatus and the display apparatus. The control apparatus may include a line-of-sight detection unit that detects the line of sight of the wearer. Detection of the line of sight may use infrared light. An infrared light emitting unit emits infrared light to the eye of the user gazing the image being displayed. A captured image of the eye is acquired by detecting, by the image capturing unit including a light-receiving element, the reflected light of the emitted infrared light from the eye. It is possible to suppress reduction of image quality by providing a reduction unit that reduces incident light from the infrared light emitting unit to the display unit in plan view.

The user's line of sight toward the displayed image is detected from the captured image of the eye acquired by image capturing using infrared light. Any known technique can be applied to line-of-sight detection using the captured image of the eye. As an example, a line-of-sight detection method can be used, which is based on a Purkinje image formed by reflection of irradiated light at the cornea.

More specifically, a line-of-sight detection process based on the pupil corneal reflection method is performed. Using the pupil corneal reflection method, the user's line of sight is detected by calculating a line-of-sight vector representing the orientation (rotation angle) of the eye, based on the image of the pupil and the Purkinje image included in the captured image of the eye.

The display apparatus according to one embodiment of the present invention includes an image capturing apparatus including a light-receiving element, and may control the image displayed on the display apparatus based on the user's line-of-sight information from the image capturing apparatus.

Specifically, the display apparatus determines, based on the line-of-sight information, a first field of view region being gazed by the user, and a second field of view region other than the first field of view region. The first field of view region and the second field of view region may be determined by the control apparatus of the display apparatus, or may be received as those determined by an external control apparatus. In the display region of the display apparatus, the display resolution of the first field of view region may be controlled to be higher than the display resolution of the second field of view region. In other words, the resolution of the second field of view region may be set lower than the first field of view region.

Or, the display region includes a first display region and a second display region, which is different from the first display region, and the region having a higher priority is determined from the first display region and the second display region, based on the line-of-sight information. The first field of view region and the second field of view region may be determined by the control apparatus of the display apparatus, or may be received as those determined by an external control apparatus. The resolution of the higher priority region may be controlled to be higher than the resolution of regions other than the higher priority region. In other words, resolution of the region with a relatively low priority may be reduced.

Here, AI may be used for determining the first field of view region or a region with a higher priority. AI may be a model configured to estimate, from an image of an eye, the angle of the line of sight and the distance to an object beyond the line of sight, using images of eyes and directions in which the eyes in the images are actually gazing, as supervised data. The AI program may be included in the display apparatus, in the image capturing apparatus, or in an external apparatus. In a case where an external apparatus includes the AI program, it is transmitted to the display apparatus via communication.

When performing display control based on the visual detection, it can be suitably applied to smart glasses further including an image capturing apparatus that captures an image of the outside. The smart glasses can display the captured external information in real time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2022-184972, filed Nov. 18, 2022, and No. 2023-108524, filed Jun. 30, 2023, which are hereby incorporated by reference herein in their entirety.

What is claimed is:

1. A light emitting apparatus comprising:
a light emitting element;
a first transistor including a main terminal and a control terminal configured to receive a first signal for controlling luminance of the light emitting element, the first transistor being configured to supply a current corresponding to a voltage between the main terminal and the control terminal to the light emitting element;
a first capacitive element including a first electrode and a second electrode; and
a second capacitive element including a third electrode and a fourth electrode, wherein
the first electrode is electrically connected to the control terminal of the first transistor,
each of the second electrode and the third electrode is electrically connected to the main terminal of the first transistor,
the fourth electrode is electrically connected to a power supply line,
the second electrode includes a first portion facing the first electrode on a surface on side of the first electrode, and
the third electrode includes a second portion, a shortest distance from the second portion to the first electrode being shorter than a shortest distance from the second portion to the first portion of the second electrode.

2. The light emitting apparatus according to claim 1 further comprising a substrate having a principal surface on which the first transistor is formed, wherein
the first electrode and the third electrode do not overlap each other in plan view of the principal surface.

3. The light emitting apparatus according to claim 2, wherein the first electrode and the third electrode are at same height from the substrate.

4. The light emitting apparatus according to claim 1, wherein
the first electrode includes a first surface including a portion facing the second electrode and a second surface opposite to the first surface, and
the second surface of the first electrode includes a portion facing the second portion of the third electrode.

5. The light emitting apparatus according to claim 1 further comprising:
a second transistor for controlling light emission or non-light emission of the light emitting element; and
a third transistor for controlling supply of the first signal to the control terminal of the first transistor.

6. The light emitting apparatus according to claim 1 further comprising a plug for electrically connecting the second electrode and the third electrode, wherein
the plug is located between the first electrode and the third electrode.

7. The light emitting apparatus according to claim 1 further comprising:
a substrate having a principal surface on which the first transistor is formed; and
a conductive member for electrically connecting the second electrode and the third electrode, wherein
a height of the conductive member from the substrate is lower than a height of each of the first electrode and the third electrode from the substrate, and
the conductive member includes a portion facing the first electrode.

8. The light emitting apparatus according to claim 1 further comprising:
a substrate having a principal surface on which the first transistor is formed; and
a conductive member for electrically connecting the fourth electrode and the power supply line, wherein
a height of the conductive member from the substrate is lower than a height of each of the first electrode and the third electrode from the substrate, and
the conductive member includes a portion facing the third electrode.

9. The light emitting apparatus according to claim 1 further comprising:
a second transistor for controlling light emission or non-light emission of the light emitting element; and
a substrate having a principal surface on which the first transistor and the second transistor are formed, wherein
the first transistor and the second transistor share an impurity region formed in the substrate,
the first electrode is located at a position overlapping an electrode functioning as a gate of the first transistor in plan view of the principal surface,
the third electrode is located at a position overlapping an electrode functioning as a gate of the second transistor in plan view of the principal surface.

10. The light emitting apparatus according to claim 1 further comprising a fourth transistor for resetting the light emitting element.

11. A display apparatus comprising: the light emitting apparatus according to claim 1; and an active element connected to the light emitting apparatus.

12. A photoelectric conversion apparatus comprising: an optical unit including a plurality of lenses; an image capturing element configured to receive light having passed through the optical unit; and a display unit configured to display an image, wherein the display unit displays an image captured by the image capturing element, and includes the light emitting apparatus according to claim 1.

13. An electronic device comprising: a housing provided with a display unit; and a communication unit that is provided to the housing and is configured to communicate with external, wherein the display unit includes the light emitting apparatus according to claim 1.

14. An illumination apparatus comprising: a light source; and at least one of a light diffusing unit and an optical film, wherein the light source includes the light emitting apparatus according to claim 1.

15. A moving body comprising: a body; and a lamp provided to the body, wherein the lamp includes the light emitting apparatus according to claim 1.

* * * * *